US010352984B2

(12) United States Patent
Thomas et al.

(10) Patent No.: US 10,352,984 B2
(45) Date of Patent: Jul. 16, 2019

(54) FAULT LOCATION IN POWER DISTRIBUTION SYSTEMS

(71) Applicant: The University of Nottingham, Nottingham (GB)

(72) Inventors: David Thomas, Nottingham (GB); Mark Sumner, Nottingham (GB); Jia Ke, Nottingham (GB)

(73) Assignee: The University of Nottingham, Nottingham (GB)

( * ) Notice: Subject to any disclaimer, the term of this patent is extended or adjusted under 35 U.S.C. 154(b) by 1006 days.

(21) Appl. No.: 14/361,294

(22) PCT Filed: Nov. 28, 2012

(86) PCT No.: PCT/GB2012/052932
§ 371 (c)(1),
(2) Date: May 28, 2014

(87) PCT Pub. No.: WO2013/079933
PCT Pub. Date: Jun. 6, 2013

(65) Prior Publication Data
US 2014/0336959 A1    Nov. 13, 2014

(30) Foreign Application Priority Data
Nov. 28, 2011    (GB) .................................. 1120477.3

(51) Int. Cl.
*G01R 31/08*    (2006.01)
(52) U.S. Cl.
CPC ........... *G01R 31/08* (2013.01); *G01R 31/085* (2013.01); *G01R 31/088* (2013.01)
(58) Field of Classification Search
CPC ..... G01R 31/08; G01R 31/088; G01R 31/085
See application file for complete search history.

(56) References Cited

U.S. PATENT DOCUMENTS 3,223,889 A * 12/1965 Schweitzer, Jr. .... H02H 1/0061
307/3
3,308,345 A *  3/1967 van Cortlandt Warrington ..........
H02H 3/347
324/509
(Continued)

FOREIGN PATENT DOCUMENTS

CN    1046045    10/1990
CN    2200248     6/1995
(Continued)

OTHER PUBLICATIONS

International Search Report and Written Opinion for PCT/GB2012/052932, dated Apr. 18, 2013, 9 pages.
(Continued)

*Primary Examiner* — Stephanie E Bloss
(74) *Attorney, Agent, or Firm* — Bryan Cave Leighton Paisner LLP

(57) ABSTRACT

A method of locating a fault on an electricity transmission line is disclosed. The transmission line has a known line impedance and is operable to transport electricity at one or more system frequencies. The method comprises using measurements of the current and voltage made on the line at one or more frequencies which are different to the system frequency and the known line impedance (Z) to determine a distance to the fault. The method may include monitoring the voltage and the current on the transmission line at the one or more non-system frequencies, and determining from the presence of signals at a non-system frequency on the transmission line that a fault has occurred.

25 Claims, 11 Drawing Sheets

(56) References Cited

U.S. PATENT DOCUMENTS

| | | | | |
|---|---|---|---|---|
| 4,156,842 A * | 5/1979 | Huang | | G01R 27/28 324/127 |
| 4,370,609 A | 1/1983 | Wilson et al. | | |
| 4,599,556 A * | 7/1986 | Lanz | | G01R 31/086 324/556 |
| 4,851,782 A * | 7/1989 | Jeerings | | G01R 25/00 324/509 |
| 4,871,971 A * | 10/1989 | Jeerings | | G01R 25/00 324/509 |
| 5,587,662 A * | 12/1996 | Kelley | | G01R 27/02 324/520 |
| 5,773,980 A * | 6/1998 | Yang | | G01R 31/088 324/522 |
| 5,825,189 A * | 10/1998 | Johns | | G01R 31/085 324/525 |
| 6,591,203 B1 | 7/2003 | Das et al. | | |
| 6,601,001 B1 | 7/2003 | Moore | | |
| 2006/0025941 A1 | 2/2006 | Rogovin | | |
| 2009/0085574 A1 | 4/2009 | Pan et al. | | |
| 2013/0096854 A1* | 4/2013 | Schweitzer, III | | G01R 31/085 702/59 |
| 2013/0107405 A1* | 5/2013 | Blumschein | | G01R 31/025 361/79 |
| 2014/0229127 A1* | 8/2014 | Ren | | H02H 3/40 702/59 |
| 2015/0081235 A1* | 3/2015 | Schweitzer, III | | G01R 31/088 702/59 |
| 2015/0226780 A1* | 8/2015 | Sun | | G01R 31/088 702/59 |

FOREIGN PATENT DOCUMENTS

| | | |
|---|---|---|
| CN | 1200177 | 11/1998 |
| CN | 1282876 | 2/2001 |
| CN | 1376930 | 10/2002 |
| CN | 1493885 | 5/2004 |
| CN | 1786726 | 6/2006 |
| CN | 1851490 | 10/2006 |
| CN | 1896756 | 1/2007 |
| CN | 101173975 | 5/2008 |
| CN | 101387682 | 3/2009 |
| CN | 101672883 | 3/2010 |
| CN | 101702510 | 5/2010 |
| CN | 201673231 | 12/2010 |
| CN | 102081132 | 6/2011 |
| CN | 102096019 | 6/2011 |
| CN | 102103179 | 6/2011 |
| DE | 19849020 A1 * | 4/2000 |
| EP | 0106790 | 4/1984 |
| EP | 996244 A2 * | 4/2000 |
| EP | 2287989 A1 | 2/2011 |
| JP | 63128272 A | 5/1988 |
| JP | 450672 | 2/1992 |
| RU | 2426998 * | 8/2011 |
| WO | 03/016850 A2 | 2/2003 |

OTHER PUBLICATIONS

Christopher E Et Al: "A DC distribution demonstrator incorporating Active Impedance Estimation for marine applications", Electrical Systems for Aircraft, Railway and Ship Propulsion (ESARS), 2010, IEEE, Piscataway, NJ, USA, Oct. 19, 2010 (Oct. 19, 2010), pp. 1-5, XPO31833320, ISBN: 978-1-4244-9092-9 the whole document.
Ke Jia, et al.—"A Novel Fault Location Algorithm Utilized In Marine System With CWT", Advanced Power System Automation and Protection (APAP), 2011 International Conference On, IEEE, Oct. 16, 2011 (Oct. 16, 2011), pp. 413-417, XPO32162377, DOI: 10.1109/APAP.2011.6180437 ISBN: 978-1-4244-9622-8 the whole document.

\* cited by examiner

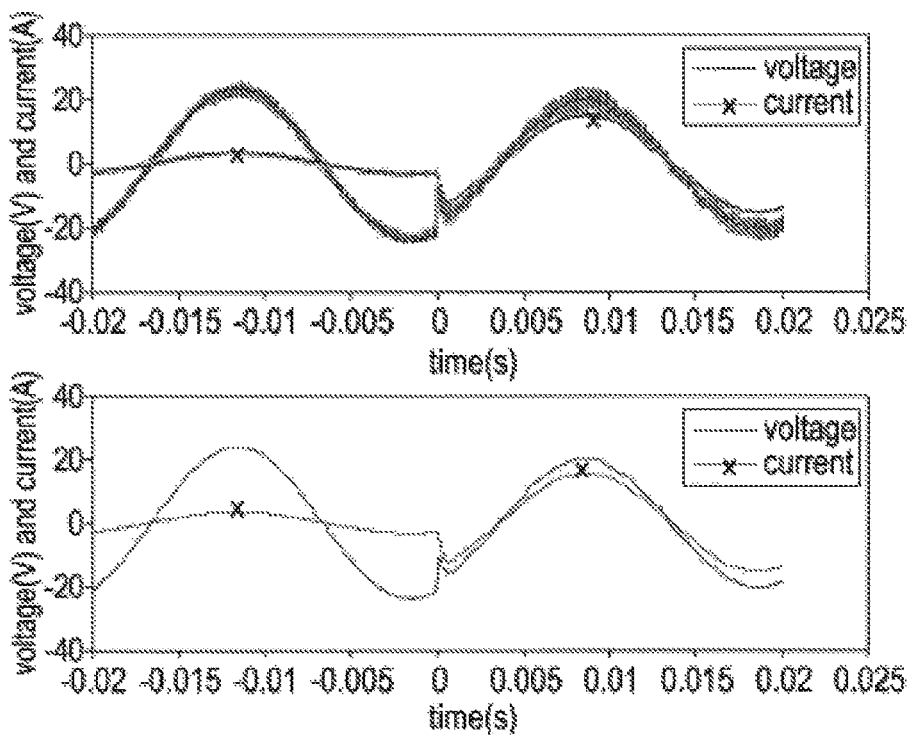
Fig. 11
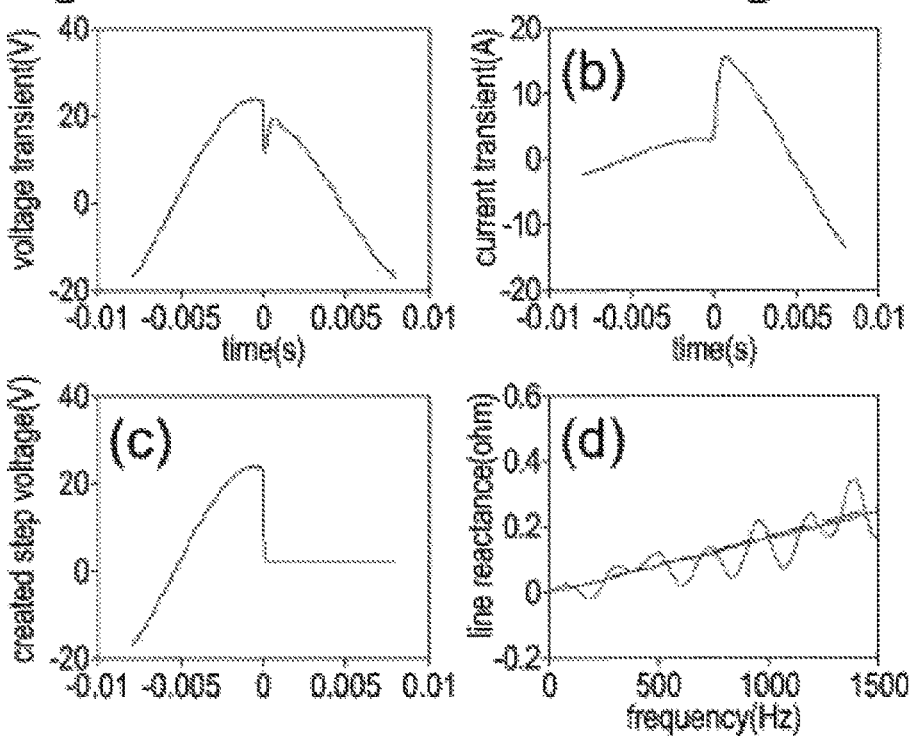
Fig. 12A
Fig. 12B
Fig. 12C
Fig. 12D

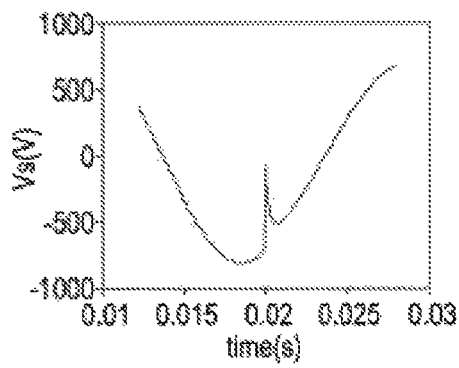
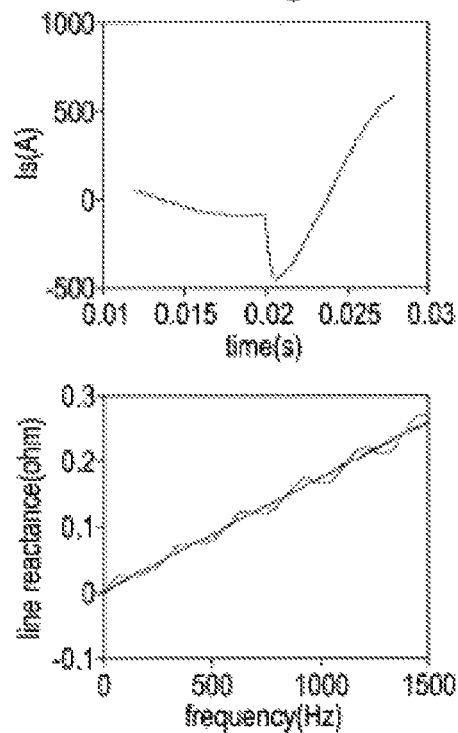
Fig. 17A  Fig. 17B
Fig. 17C  Fig. 17D
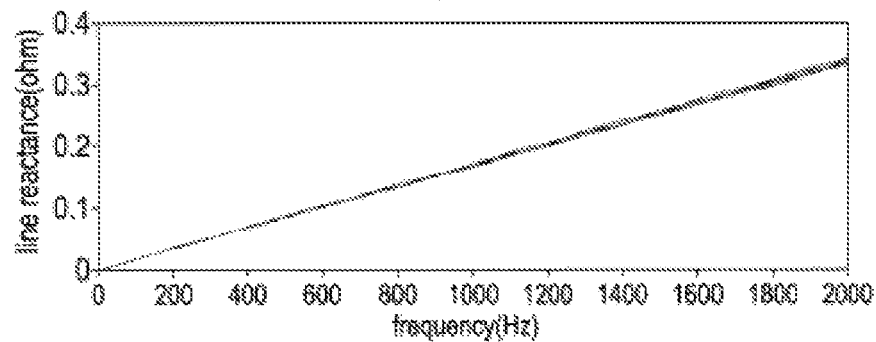
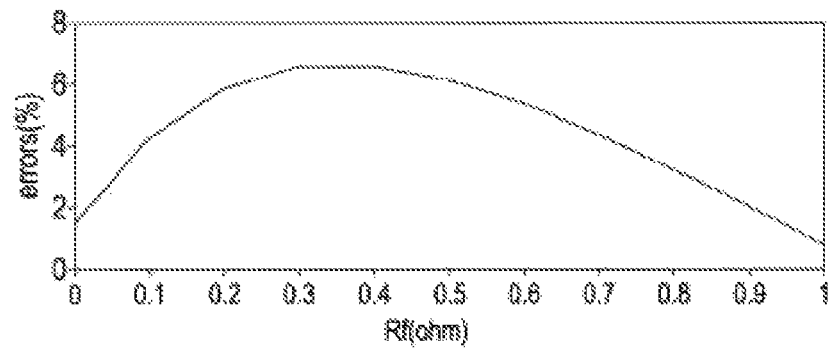
Fig. 18

FAULT LOCATION IN POWER DISTRIBUTION SYSTEMS

CROSS-REFERENCE TO RELATED APPLICATIONS

This application is a national stage application under 35 U.S.C. 371 of and claims priority to International Application No. PCT/GB2012/052932, filed Nov. 28, 2012. International Application No. PCT/GB2012/052932 claims priority to Great Britain Application No. 1120477.3, filed Nov. 28, 2011. Both International Application No. PCT/GB2012/052932 and Great Britain Application No. 1120477.3 are incorporated herein by reference.

TECHNICAL FIELD

The present invention relates to fault location in power distribution systems, and particularly but not exclusively to fault location on a transmission line using the impedance of the transmission line.

BACKGROUND

As used herein, the term 'power distribution system' means apparatus for distributing electricity from one location to another in real time. An example of a power distribution system is the UK national electricity distribution system known as the National Grid. Another example of a power distribution system is a vehicle integrated power system (IPS). Such systems are used in the transport industry for transporting electricity throughout a vehicle from a generator to the various systems of the vehicle.

In general, power distribution systems are arranged to carry electrical currents on transmission lines at a specified system frequency. In the UK and Europe, electricity is transported at a system frequency of approximately 50 Hz, whilst in North America electricity is transported at a system frequency of approximately 60 Hz.

In the event that part of a power distribution system experiences a fault, such as a break or a short-circuit in a transmission line, it is desirable to locate that fault as quickly and as accurately as possible so that the fault may be repaired. One way of locating a fault in a transmission line is to look for an apparent change in the impedance of the line at the system frequency. This method is robust, and is typically accurate to within a few kilometers.

BRIEF DESCRIPTION OF DRAWINGS

To facilitate further description of the embodiments, the following drawings are provided in which:

FIG. 11 illustrates the voltage and current on the transmission line measured before, during and after a fault (at zero time) without filtering (top graph) and with filtering (bottom graph);

FIG. 12A illustrates for fault 3 of FIG. 10 the measured (filtered) voltage transient signal;

FIG. 12B illustrates for fault 3 of FIG. 10 the measured (filtered) current transient signal;

FIG. 12C illustrates for fault 3 of FIG. 10 the estimated step voltage at the fault ($V_{fault\_point}$);

FIG. 12D illustrates for fault 3 of FIG. 10 the estimated line reactance to fault 3;

FIG. 17A illustrates for fault 3 of FIG. 10 the measured (filtered) voltage transient signal with a 600V AC voltage supply;

FIG. 17B illustrates for fault 3 of FIG. 10 the measured (filtered) current transient signal with a 600V AC voltage supply;

FIG. 17C illustrates for fault 3 of FIG. 10 the estimated step voltage at the fault ($V_{fault\_point}$) with a 600V AC voltage supply;

FIG. 17D illustrates for fault 3 of FIG. 10 the estimated line reactance to fault 3 with a 600V AC voltage supply;

FIG. 18 shows the estimated line reactance at fault 3 for different fault resistances (0-1 Ohms), in particular, the estimated line reactance against frequency (top graph) and the estimated errors against fault resistance (bottom graph)

DETAILED DESCRIPTION

Figure 1:
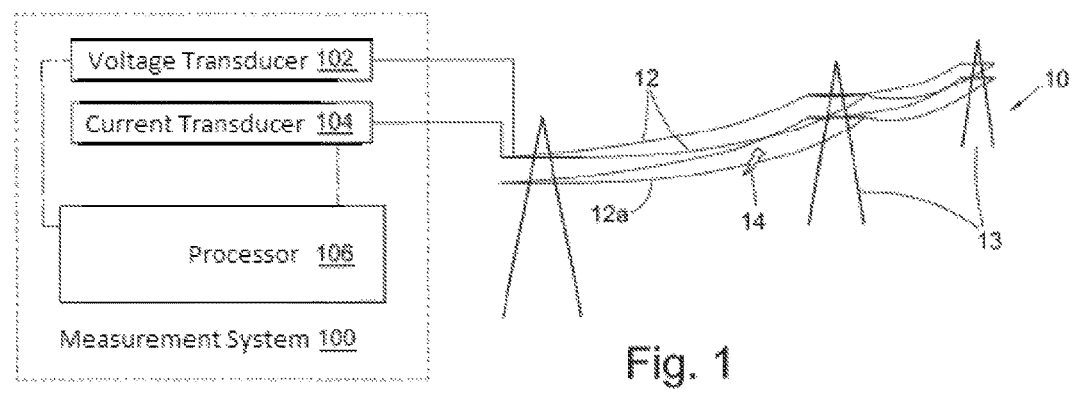
FIG. 1 schematically shows a power distribution system including a transmission line subject to a fault.

There is an increasing need to be more accurate in finding the location of faults in transmission lines. For example, in a vehicle integrated power system, it may be desirable to locate the fault to within a few meters. This is because lines included in a vehicle IPS are likely to run within the walls of the vehicle. The fewer wall panels that need to be opened up to locate and repair the fault the better.

In general, the more accurately a fault can be located in a power distribution system, the more quickly it can be found and repaired.

An alternative, and more accurate, fault location method is known as a travelling wave method. In a travelling wave method a signal is applied to a transmission line under test at a measurement location. The signal is reflected back from the fault and the reflection is detected at the same measurement location. The distance to the break can be determined with high accuracy (for example within 1 to 2 meters) by measuring the time taken until the reflected signal is detected. Typically the travelling signal is a high-frequency signal of low amplitude (in comparison to the amplitude of the electrical signal usually carried by the line). Such signals are prone to interference from other electrical sources, such as radio waves, and thus this method is not robust. In addition, specialist (and expensive) transducers are needed to transmit and receive the high-frequency signals.

Some embodiments can be implemented to provide an alternative fault location method.

Some embodiments include a method of locating a fault on an electricity transmission line, the transmission line having a known line impedance and being operable to transport electricity at one or more system frequencies, wherein the method comprises using measurements of the current and voltage made on the line at one or more frequencies which are different to the system frequency and the known line impedance to determine a distance to the fault.

As used herein, the phrase 'known line impedance' means the normal impedance of the line, i.e. prior to the fault. The known line impedance is frequency dependent (i.e. varies with frequency). The known line impedance may be found, for example, directly from calibration, or estimated from the line geometry (i.e. using the wire radius and separation).

The above method takes advantage of the fact that a fault on a line is itself a source of transient currents. These transient currents appear at frequencies different to the system frequency, and can be used to determine the location of the fault before they die away. As used herein the term 'transients' means all voltage and current signals outside the steady state values which are due to the signal being transmitted at the system frequency. Transient signals are assumed to be superimposed on the steady state signals.

The above method is passive, in that it does not require an external signal to be applied to the line. The only signals used in determining the location of the fault are those already on the line/generated by the fault. This means that no expensive signal transmission equipment is required.

The method may comprise measuring the current and voltage on the transmission line, and in particular, measuring the transient current and voltage on the transmission line. The transient current and voltage may be measured at a measurement location, which may be different to, for example remote from, the fault location. The current and voltage may be measured at only one measurement location, in some embodiments, or at more than one measurement location in other embodiments.

In one embodiment, the current and voltage may be measured at a first measurement location and at a second measurement location, and are preferably measured substantially simultaneously at both measurement locations. The first measurement location may be disposed on a first side of the fault and the second measurement location may be disposed on a second side of the fault, such that the fault is located between the two measurement locations.

The method may comprise measuring the current and voltage on the transmission line at a non-system frequency after the fault has occurred. The method may further comprise measuring the voltage, and possibly the current, on the transmission line at a non-system frequency before the fault has occurred.

The method may comprise monitoring the voltage and the current on the transmission line, and may comprise detecting whether a fault has occurred. The presence of transient signals on the transmission line may be taken as an indicator that a fault has occurred.

Monitoring the voltage and current may comprise regularly and/or continuously, measuring the voltage and current on the transmission line.

The method may comprise measuring the transient voltage and current signals on the transmission line during a predetermined time period after the fault has occurred. The predetermined time period may be less than 20 ms, and may be less than 15 ms. The predetermined time period may be less than 10 ms, for example, 8 ms.

The method may further comprise rendering the measured transient voltage and current into the frequency domain, for example using a Fourier transform.

The method may comprise using measurements of transient voltage and current at a plurality of frequencies which are each different to the system frequency and different to each other to create a plurality of distance estimates. The plurality of voltage and current measurements may be conducted over the same time period, for example simultaneously. The plurality of distance estimates may be compared to determine the distance to the fault. For example, an average distance, such as a mean or mode might be calculated, or the distance to the fault might be determined from a normal distribution including the plurality of distance estimates. The average distance might be calculated after outlying estimates have been discarded.

The (or each) frequency of measurement might be above the system frequency and less than a specified maximum frequency, which might be for example 10,000 Hz. The (or each) frequency of measurement might be remote from the system frequency, for example more than 50% greater than the system frequency. The (or each) frequency of measurement might be below the system frequency, for example more than 50% less than the system frequency. Preferably the frequencies of measurement are above the system frequency.

Where the system frequency is 50 or 60 Hz, the measurement frequency or frequencies might be between 70 Hz or 80 Hz and 10,000 Hz, for example between 100 and 5000 Hz. The measurement frequency or frequencies might be between 100 and 3000 Hz, for example between 500 and 2500 Hz or between 500 and 1500 Hz.

Where the system frequency is 0 (for a DC signal) the measurement frequency or frequencies might be above 20 Hz and less than 10,000 Hz, for example between 20 Hz and 2500 Hz.

Where the system frequency is 400 (e.g. for an aircraft distribution system) the measurement frequency or frequencies might be above 450 Hz and less than 10,000 Hz, for example between 500 Hz and 2500 Hz.

The measured transient voltage and current may be used to estimate the line impedance of the transmission line at the time of the fault.

The distance to the fault $x_f$ may be calculated from the estimated line impedance of the transmission line $Z_{line}$ at the time of the fault using the known line impedance. In particular, the distance to the fault may be calculated using $Z_{line} = Z_{line\_P} \cdot x_f$, where $Z_{line\_P}$ is the known line impedance per unit length. The known line impedance per unit length $Z_{line\_P}$ may be calculated from the known line impedance (which may be measured/calibrated prior to the fault) and the total length of the line (which may be measured prior to the fault/known). For example, the line impedance may be estimated from the known line cross-section geometry (e.g. conductor diameter and separation).

Estimating the line impedance may comprise determining the source impedance $Z_s$ (which is the impedance of the Thèvenin equivalent voltage source of the power distribution system at the measurement location). Determining the source impedance may comprise calculating the source impedance using the measured transient current $I_f$ and transient voltage $V_f$ (note that $I_f$ and $V_f$ refer to frequency domain quantities which are complex numbers (phasors) with amplitude and phase). The source impedance may be calculated using:

$$Z_s = V_f / I_f. \tag{1}$$

Estimating the line impedance may comprise estimating the voltage at the fault location $V_{pre\_f}$. Estimating the voltage at the fault location $V_{pre\_f}$ may comprise assuming $V_{pre\_f}$ to be a step waveform with the step value equal to the measured prefault voltage at the measurement location.

The distance to the fault $x_f$ may be calculated from the line impedance using:

$$x_f = (V_{pre\_f}/I_f - V_f/I_f)/Z_{line\_P}. \tag{2}$$

The method may comprise conducting a first 'voltage' iteration.

The voltage iteration may comprise a first voltage iteration step. The first voltage iteration step may comprise calculating a first estimated distance to the fault $x_{f1}$. Calculating a first estimated distance to the fault $x_{f1}$ may include calculating a distance to the fault from the line reactance. In particular, a first estimated distance to the fault $x_{f1}$ may be calculated using:

$$x_{f1} = \frac{imag(V_{pre-f}/I_f - V_f/I_f)}{imag(Z_{line\_P})}. \tag{3}$$

Calculating the first distance estimate $x_{f1}$ may comprise estimating a first voltage $V_1$ for the voltage at the fault location $V_{pre\_f}$. The first voltage $V_1$ may be estimated using the voltage, for example at the measurement location, prior to the fault occurring.

The voltage iteration may include a second voltage iteration step, which may comprise using the first estimated distance to the fault $x_{f1}$ and the first voltage $V_1$ to estimate a second voltage $V_2$ for the voltage at the fault location. The second voltage $V_2$ may be calculated using:

$$V_2 = V_1 - I_{pre\_f} Z_{line\_P} x_{f1}. \tag{4}$$

The voltage iteration may include a third voltage iteration step, which may comprise using the second voltage $V_2$ to calculate a second estimated distance to the fault $x_{f2}$. The second estimated distance to the fault may be calculated using equation (3) (mutatis mutandi, in this case with $x_{f1}$ replaced with $x_{f2}$, and $V_{pre\_f}$ replaced with $V_2$).

The second and third voltage iteration steps may be repeated a plurality of times, for example until the estimated distances converge to within a predetermined margin of error (which might be, for example $\pm 100$ m, $\pm 10$ m, $\pm -1$ m or $\pm 0.5$ m).

Estimating the distance to the fault point may comprise estimating the resistance of the fault $R_f$. On the assumption that the line resistance is negligible, the resistance of the fault may be estimated using:

$$R_f = real(V_{pre\_f}/I_f - V_f/I_f). \tag{5}$$

where $V_{pre\_f}$ is an estimate for the voltage at the fault location, as described above.

The distance to the fault $x_f$ may be calculated from the line impedance using:

$$Z_{line\_P} \cdot x_f = V_{pre\_f}/I_f - R_f - V_f/I_f - (I_{load}/I_s) \cdot R_f. \tag{6}$$

The method may comprise conducting a second 'impedance' iteration.

The impedance iteration may comprise a first impedance iteration step. The first impedance iteration step may comprise calculating a first estimated distance to the fault $x_{f1}$. Calculating a first estimated distance to the fault $x_{f1}$ may comprise estimating a first voltage $V_1$ for the voltage at the fault location $V_{pre\_f}$ and calculating a first estimate for the line resistance $R_f$. The first voltage $V_1$ may be estimated using the voltage, for example at the measurement location, prior to the fault occurring. Calculating a first estimated distance to the fault $x_{f1}$ may further comprise setting $(I_{load}/I_s) \cdot R_f = 0$ in equation (6).

The impedance iteration may include a second impedance iteration step, which may comprise using the first estimated distance to the fault $x_{f1}$ to estimate a first load current $I_{load}$. The first load current $I_{load}$ may be calculated using:

$$\left. \begin{array}{c} \dfrac{I_{load}}{I_s} = \dfrac{Z_s + Z_{line_p} x_f}{Z_{load} + Z_{line} - Z_x} \\ Z_s = \dfrac{V_s}{I_s} \end{array} \right\}. \tag{7}$$

The impedance iteration may include a third impedance iteration step, which may comprise using first load current $I_{load}$ to calculate a second estimated distance to the fault $x_{f2}$. The second estimated distance to the fault may be calculated using equation (6) (mutatis mutandi).

The second and third impedance iteration steps may be repeated a plurality of times, for example until the estimated distances converge to within a predetermined margin of error (which might be, for example $\pm 100$ m, $\pm 10$ m, $\pm 1$ m or $\pm 0.5$ m).

The resistance of the fault may be estimated prior to producing a distance estimate. The method may comprise determining, based on the estimated fault resistance, whether to implement the voltage iteration steps to determine the distance to the fault, or whether to implement the impedance iteration steps to determine the distance to the fault. The determination might be based on a comparison between the estimated fault resistance and the load resistance.

Where the method comprises measuring the current and voltage at two measurement locations, the distance $x_{f1}$ to the fault from the first location may be calculated using:

$$x_{f1} = \frac{V_2 - V_1 + I_2 \cdot Z_T}{Z_{line\_P} \cdot (I_1 + I_2)}, \tag{8}$$

where $V_1$, $I_1$ are the voltage and current transients recorded at the first location, $V_2$, $I_2$ are the voltage and current transients recorded at the second location, and $Z_T$ is the total line impedance between the two measurement points.

The voltage and current transients recorded at the first location may be synchronised with the voltage and current transients recorded at the second location, for example by synchronising the phases of the measurements.

The method may comprise the step of calibrating the transmission line to determine the known line impedance.

Some embodiments include a system for locating a fault on an electricity transmission line, the transmission line having a known line impedance and being operable to transport electricity at one or more system frequencies, wherein the system includes a processor operable to use measurements of the current and voltage on the line, measured at one or more frequencies which are different to the system frequency, and the known line impedance, to determine a distance to the fault.

The system may be operable to implement various embodiments of the methods as described herein.

The system may comprise apparatus for measuring voltage on the transmission line at a frequency which is different to the system frequency, and apparatus for measuring current on the transmission line at a frequency which is different to the system frequency. The system may comprise two sets of such apparatus, one for use at a first measurement location on a transmission line and the other for use at a second measurement location on the transmission line. The system may comprise a communication channel.

Some embodiments include a data carrier encoded with computer-readable instructions, which, when read by a computer, are operable to cause the computer to carry out the various embodiments of the methods as described herein.

Embodiments of systems and methods will now be described, by way of example only, with reference to the accompanying drawings.

Referring firstly to FIG. 1, a power distribution system 10 is shown. The power distribution system includes a plurality of transmission lines 12 conveyed by pylons 13. One of the transmission lines 12a in the power distribution system 10 includes a fault 14. The power distribution system 10 is operable to transport electricity at one or more system frequencies, which in this example is 50 Hz. The transmission lines 12 each have a known line impedance, which might be calculated, calibrated, or otherwise known.

The power distribution system 10 further includes measurement system 100, which in this example includes a voltage transducer 102 and current transducer 104 for measuring the voltage and current on the transmission line at a non-system frequency. The measurement apparatus includes a processor 106 operable to use the measurements of the current and voltage made (in this example) by the voltage and current transducers to determine a distance to the fault. In this example, the processor is remote from the transmission line, and is located in a control centre of the power distribution system. Alternatively, the processor might be, for example, part of a relay controlling a local circuit breaker. The processor is encoded with instructions to carry out one or more of the methods described below to determine the distance to the fault.

In the measurement system, as in a conventional protection unit, the voltage and current on the transmission line are monitored continuously. When a fault occurs an over current trip indicates the presence of fault transients. In contrast to a conventional system, however, when the measurement system 100 detects the presence of fault transients the system initiates the measurement of the transient signals as sampled time domain data over a predetermined time period. The predetermined time period is typically 8 ms, but could be shorter or longer depending on the frequency resolution required.

The captured transient voltage and current data is sent to the processor, which Fourier transforms the data into the frequency domain, and carries out one or more of the methods described below to determine an estimate for the location of the fault.

In the first example, the measurement system 100 is a single ended system, that is, the measurement system is arranged to generate an estimate for the fault location based on measurements made at one end of the transmission line only.

One method of locating a fault 14 on a transmission line 12a using such a single ended measurement system is outlined in FIG. 5, and is described in more detail below with reference to FIG. 2.

Figure 2:
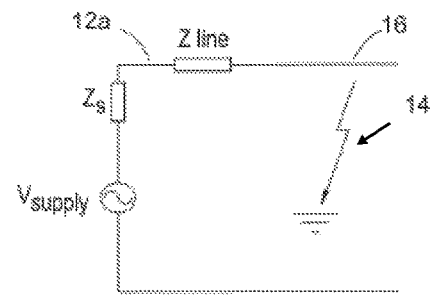
FIG. 2 shows an example of a single phase circuit with a low impedance fault.

FIG. 2 shows a simplified circuit diagram representing the transmission line 12a and fault 14. In particular, FIG. 2 shows a single-zone circuit through which a single phase current is caused to flow by a voltage source $V_{supply}$. The circuit has an impedance Z, which includes $Z_s$, the impedance of the voltage source and $Z_{line}$, the impedance of the transmission line 12a.

The distance $x_f$ to the fault can be determined from the impedance of the transmission line $Z_{line}$ between the fault and the source. In particular, the line impedance $Z_{line}$ can be thought of in terms of distance x as being equal to the line impedance per unit length $Z_{line\_P}$ multiplied by the length of the line x. Thus if the line impedance at the time of the fault can be measured/estimated, it can be used to determine the distance to the fault using the known line impedance prior to the fault, and in particular the known line impedance per unit length $Z_{line\_P}$.

Because the method described below is single ended (i.e. based on measurements made at only one measurement location, at one side of the fault location), in order to determine the line impedance at the time of the fault, it is necessary to know (or be able to reasonably estimate) the voltage at the fault location 16. However, the fault voltage is unknown, as well as the fault impedance.

When a fault 14 occurs on a line 12a, transient signals are created in the line. These signals generally occur over a range of frequencies, including frequencies which are different to the system frequency, and die away after a short time. We have determined that it is possible to estimate the line impedance from measurements of the transient current and transient voltage taken at a measurement location 18 which is remote from the fault location, as set out in step S1 of FIG. 5. The measured voltage and current of the transient signal can then be used, together with the known line impedance of the transmission line and an estimate of the initial prefault voltage, to calculate a first estimate for the distance to the fault, as shown in step S2 of FIG. 5, and as described in more detail below.

For a more accurate result, the method can be carried out at a number of different frequencies, each of which is different to the system frequency, as indicated in step S3. For example the transient current and voltage might be measured at a first frequency, which might for example be 2000 Hz, and simultaneously measured at second, third and fourth frequencies, e.g. 1000 Hz, 1500 Hz and 2500 Hz. More or fewer voltage and current measurements might be taken, at different frequencies, as required. For example, a plurality of different frequencies might be selected in the range 80 Hz to 10,000 Hz, and/or in the range 0 (for DC power systems) to 20 Hz. As mentioned above, typically measurements of transient voltage and currents are made over a predetermined time period, and a frequency range is taken from the Fourier transform of the time domain data.

The frequency resolution required will depend on the window length of the time data.

Each set of voltage and current measurements (i.e. all the measurements at one frequency) are then used to produce an estimate for the distance to the fault. These plurality of estimates are then used to select a value for the distance to the fault, as set out in step S4.

When selecting the value for the distance to the fault, the plurality of estimates may simply be combined, for example averaged using a normal distribution. However, we have found that sometimes a measurement at a particular frequency is very inaccurate, perhaps because that frequency marks a resonance of the system. It can therefore be useful to compare the plurality of measurements first, and discard outlying measurements, such as those that are obviously inaccurate (for example because they give a physically nonsensical result), before taking an average.

Figure 5:
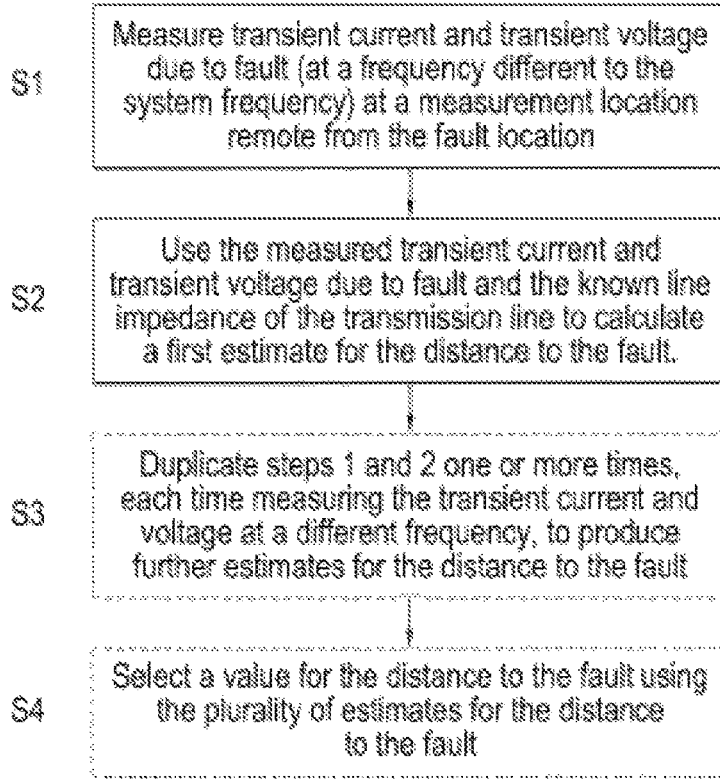
FIG. 5 is a flow chart depicting a method of locating a fault on a transmission line.
Figure 6:
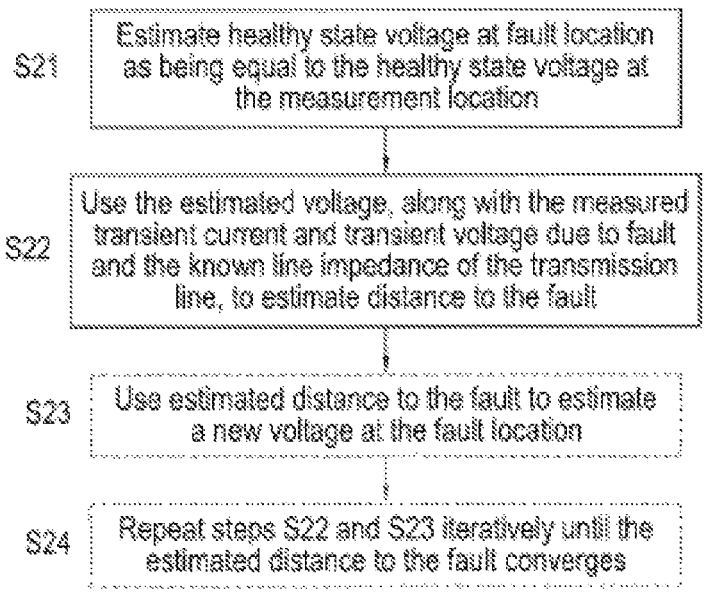
FIG. 6 is a flow chart depicting one way of executing step S2 of the method of FIG. 5.

Referring now to FIG. 6, one way of executing steps 1 and 2 of the method of FIG. 5 to produce an estimate for the distance to a fault is described.

Figure 3:
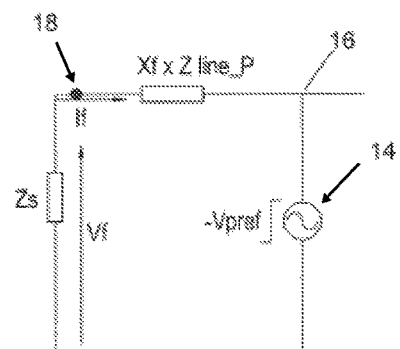
FIG. 3 shows the Thèvenin circuit equivalent to the circuit of FIG. 2, at a non-system frequency.

As mentioned above, the distance to a fault can be determined by considering the impedance of the transmission line. The line impedance $Z_{line}$ is only part of the total impedance Z of the circuit, which also includes a source impedance $Z_s$ (which is the impedance of the Thèvenin equivalent voltage source), a load impedance and a fault impedance. Where the fault impedance is small with respect to the load impedance, it is possible to disregard the load impedance and fault impedance, and only consider the source and line impedance. This simple case is shown in FIGS. 2 and 3, and will be discussed first.

A fault on a transmission line generates transient voltage and current signals in the line. The transient currents created by the fault can be considered to be due to a harmonic voltage source at the fault location. It is noted that for frequencies other than the system frequency the supply emf can be ignored and so the only source is the fault location itself. This is shown schematically in FIG. 3, which shows the Thèvenin circuit equivalent to the circuit of FIG. 2, at a non-fundamental (i.e. non-system or harmonic of the system) frequency. The circuit includes a supply voltage which is short-circuited by the fault 14.

The voltage induced by the fault can be considered to be equal and opposite voltage to the instantaneous pre-fault voltage $V_{pre-f}$ at the fault location, so causing the system voltage to collapse at the initiation of the fault. Essentially the induced transient is a step function starting at the initiation of the fault which will comprise a range of frequencies therefore the fault can be considered to be a source of high frequency transients.

The line impedance $Z_{line}$ between measurement location 18 and the fault point 16 can be calculated from the following calculations (equations (9)-(11)).

The source impedance can be found from the voltage transient $V_f$ and the current transients $I_f$ measured at the measurement point using Ohm's law:

$$Z_s = \frac{V_f}{I_f}. \quad (9)$$

Note that in this example both $V_f$ and $I_f$ are frequency domain quantities derived from a Fourier transform of voltage/current measurements made in the time domain. Thus $V_f$ and $I_f$ are complex numbers (phasors) with amplitude and phase.

The total source and line impedance can be found in terms of the pre-fault voltage at the fault location $V_{pre-f}$ and the measured transient current $I_f$.

$$Z_s + Z_{line\_P} x_f = \frac{V_{pre-f}}{I_f}, \quad (10)$$

where $Z_{line\_P}$ is the per-Unit length impedance of the line and $x_f$ is the fault distance from the measurement point.

Thus the line impedance $Z_{line} = Z_{line\_P} \cdot x_f$ between the measurement point and the fault location can be obtained from:

$$Z_{line\_P} x_f = \frac{V_{pre-f}}{I_f} - \frac{V_f}{I_f}. \quad (11)$$

The pre-fault voltage at the fault location $V_{pre-f}$ is unknown. However, this can be estimated to be a step waveform with the step value (occurring at the fault time) being equal and opposite to $V_{fault-point}$, which is defined as the healthy state voltage at the fault point at the time of the fault. $V_{fault-point}$ is defined as the voltage at the fault location immediately before the initiation of the fault. It is at the system frequency (provided there are no harmonics on the system before the fault is initiated). The amplitude of the fault transients at each frequency come from the Fourier transform of the step function induced by the fault which in the time domain has an initial amplitude $V_{pre-f}$.

$V_{fault-point}$ is unknown, but can be initially estimated to be equal to the healthy state voltage $V_1$ at the measurement point immediately prior to the time of initiation of the fault. This is based upon the assumption that the voltage drop between the measurement location 18 and the point 16 at which the fault occurs is negligible. In reality this may not be the case, and so this assumption is likely to lead to an initial error in the fault distance estimation.

The error in the fault distance estimation is due to the difference between the pre-fault voltage estimated at the measuring point ($V'_{fault-point} = V_1$) and the actual pre-fault voltage at the fault location ($V_{fault-point}$). This is described in equation (12):

$$V_{fault-point} = V'_{fault-point} - I_{pre-f} Z_{line\_P} x_f, \quad (12)$$

where $I_{pre-f}$ is the line current immediately before the initiation of the fault and can be found at the measurement point.

Initially, the fault location and fault resistance are unknown. However, an initial estimate $x_{f1}$ for the distance to the fault location can be formed from the imaginary part of equation (11) (which represents the line reactance), because this part is independent of the fault resistance. Thus a first estimate $x_{f1}$ for the distance to the fault location can be produced from:

$$x_f = \frac{\text{imag}\left(\dfrac{V_{pre-f}}{I_f} - \dfrac{V_f}{I_f}\right)}{\text{imag}(Z_{line\_P})}. \quad (13)$$

This first estimate of the fault distance can be used in equation (12) to compensate the estimated pre-fault voltage $V'_{fault\_point}$. That is, a new estimate for the voltage at the fault point $V_2$ can be produced by substituting the calculated first distance estimate $x_{f1}$ and the estimated voltage $V_1$ into equation (12).

A second estimate $x_{f2}$ for the fault location can then be produced using equation (13).

If necessary this iteration can be repeated, and a further updated estimate of the pre-fault voltage $V_3$ can be produced from the new estimated distance, and the pre-fault voltage $V_2$ at the fault location can be re-compensated. This iteration procedure can be repeated a plurality of times until the solution converges to within a reasonable tolerance. For example, the iteration might be completed until the change in the distance estimates lies within an acceptable margin of error, which might vary from application to application. Where the power distribution system is a vehicle IPS, the iteration might be completed until the distance values agree to within ±0.5 m.

Table 1 shows an example of this iteration procedure for a fault that occurred at the end of a 20 m long distribution line.

TABLE 1

Iteration procedure

| iteration steps | estimated fault distance (m) |
| --- | --- |
| 0 | 26 |
| 1 | 17 |
| 2 | 23 |
| 3 | 18.7 |
| 4 | 20.2 |

As shown in table 1, when a fault occurs at 20 m of the line, the results of initial fault distance estimation is longer than 20 m. This is because the initial estimate $V_1$ of the voltage at the fault point has been estimated as the voltage at the measurement point, which is larger than the actual value.

The first estimated distance $x_{f1}$ is then used to estimate a new voltage $V_2$ by substitution into equation (12), which can then be used iteratively in equation (13). As can be seen in Table 1, this iteration procedure converges quite rapidly.

The above method assumes the impedance of the fault is small. For high impedance faults we need to consider the remote or load end of the transmission line as given in FIG. 4A. A 'high impedance' fault is considered to be a fault where the resistance of the fault (determined as discussed below) is comparable to the resistance of the load. For example, if the estimated fault resistance is 50% or more of the estimated load resistance, the impedance iteration might be used. If the estimated fault resistance is less than 50% of the estimated load resistance, the voltage iteration described above might be used.

Figures 4A, 4B:
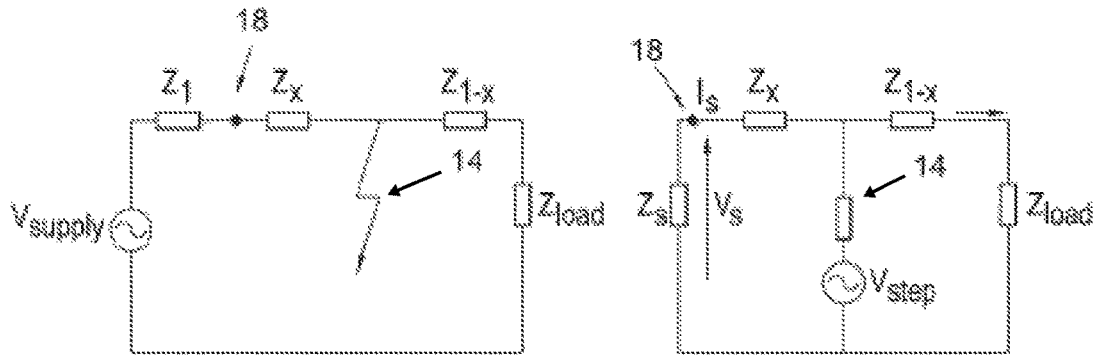
FIG. 4A shows an example of a single phase circuit including a high impedance fault.
FIG. 4B shows the Thèvenin circuit equivalent to the circuit of FIG. 4A, at a non-system frequency.

FIG. 4A shows a circuit similar to that of FIG. 2, having a supply voltage $V_{supply}$ with a supply impedance $Z_s$, and a line impedance $Z_x$ between the supply and the fault. However FIG. 4A also shows the load impedance $Z_{load}$ on the circuit, and the line impedance $Z_1$ between the fault and the remote end of the transmission line.

The Thévenin equivalent circuit of the system shown in FIG. 4A is shown in FIG. 4B during the fault transient situation at a non-system frequency. As before, the fault is modelled as a harmonic voltage source at the fault location 16.

In this case, if the fault impedance is comparable to the load impedance, the main reason for the error in the first estimation of the fault location is not the voltage drop from voltage measurement point to the point at which the fault occurs (as described above) but is instead due to the contribution of the load to the fault current.

For this general system where the fault impedance is significant, equation (11) must be modified as below:

$$Z_{linep} x_f = \frac{V_{fault-point}}{I_s} - R_f - \frac{V_s}{I_s} - \frac{I_{load}}{I_s} R_f. \quad (14)$$

In equation (14), the $V_s$ and $I_s$ are the transient voltage and current respectively (again, rendered into the frequency domain), at a non-system frequency, measured at the measurement location 18 as before. Similarly $V_{fault\_point}$ is a step waveform estimated using the pre-fault value of $V_s$ as mentioned before. $R_f$ (the fault resistance) can be calculated using the following equation:

$$\left. \begin{array}{c} R_f + R_x = \text{real}\left( \dfrac{V_{fault point}}{I_s} - \dfrac{V_s}{I_s} \right) \\ R_x \ll R_f \\ R_f \approx \text{real}\left( \dfrac{V_{fault point}}{I_s} = \dfrac{V_s}{I_s} \right) \end{array} \right\} . \quad (15)$$

As in equation (13), $R_x$ is the real part of the line impedance between the measurement point and the fault point and is, for this situation, much smaller than the fault impedance, and so can be neglected.

We can also calculate $I_{load}/I_s$ (where $I_{load}$ is the current at the load end of the circuit after the fault has occurred) using the following equation:

$$\left. \begin{array}{c} \dfrac{I_{load}}{I_s} = \dfrac{Z_s + Z_{linep} x_f}{Z_{load} + Z_{line} - Z_x} \\ Z_s = \dfrac{V_s}{I_s} \end{array} \right\}. \quad (16)$$

In equation (16), $Z_{line}$ is the total line impedance (i.e. $Z_x + Z_{1-x}$) and for a unknown load $Z_{load}$ can be calculated by using steady state voltage and current at the measurement point before fault occurs (for radial distribution systems).

Equations (14)-(16) can be repeated in an iteration process in the same way as the voltage iteration described in equations (12) and (13).

In particular, the line impedance $Z_{line\ p} x_f$ (distance of fault) is firstly calculated by substituting the estimated value for $R_f$ (from equation (15) into equation (14). During this calculation the term $$\frac{I_{load}}{I_s}$$

is set to zero (this is permissible because $I_s \gg I_{load}$). Equation (16) can then be used with the first calculated $Z_{line\ p} x_f$ to estimate a first value for The calculated value for $$\frac{I_{load}}{I_s}$$

can then be substituted into equation (14) to produce a second, updated, value for $Z_{line\_p}x_f$. The second result of equation (14) can be used in equation (16) for another step of iteration. The iteration can be repeated in the same way as described with respect to the voltage iteration discussed above until the error is within an acceptable margin.

Above we have described two possible ways of estimating the distance to a fault on a transmission line using measurements of current and voltage made at a single location which is remote from the fault and at one or more frequencies which are different to the system frequency. It is possible to determine which set of iteration equations to use (i.e. voltage equations (12) and (13) or impedance equations (14)-(16)) by first estimating the fault resistance using equation (15). If equation (15) indicates a significant fault resistance, the impedance iteration should be used (equations (14)-(16)). However, if equation (15) indicates a low fault resistance, the voltage iteration can be used (equations (12) and (13)).

To summarise, a methodology of accurately determining the location of a fault occurring in an electrical distribution line or cable may include some or all of the following steps:

i) Detecting at a point at one end of the line or cable a disturbance in the voltage and current resulting from the occurrence of the fault, and recording the voltage and current transients due to the fault over a predetermined time period ii) Noting the amplitude and phase of the steady state voltage and currents at the system frequency and its harmonics just prior to the initiation of the fault induced transients iii) From the steady state amplitudes and phases of the voltages and currents noted in (ii), estimating the amplitude of the transients induced at the fault location.

iv) Rendering the recorded voltage and current transients into the frequency domain (e.g. through the use of bandpass filters or Fourier transforms or Wavelet transforms).

v) Estimating the fault impedance from the recorded frequency domain voltage and current transients and the estimated fault induced transients derived in (iii)

vi) If the estimated fault impedance is comparable to the load impedance, estimating the impedance of the line or cable between the detection point and the fault location by including the load current effect and using the recorded frequency domain voltage and current transients and the estimated fault induced transients derived in (iii) (i.e. using the impedance iteration)

vii) If the estimated fault impedance is significantly less than the load impedance, estimating the impedance of the line or cable between the detection point and the fault location by neglecting the load current effect and using the recorded frequency domain voltage and current transients and the estimated fault induced transients derived in (iii) (i.e. using the voltage iteration)

viii) Estimating the fault location by dividing the estimated impedance of the line or cable between the detection point and the fault location given by (vi) or (vii) by the impedance per unit length of the transmission line ix) Comparing the fault location given in (viii) with a previous estimate of the fault location (if available)

x) If there is a significant change in estimates of the fault location noted in (ix) (or if there is no previous estimate of fault location) then from the steady state amplitudes and phases of the voltages and currents noted in (ii) and the new estimate of the fault location, estimating the amplitude of the transients induced at the fault location then repeat (iii) to (ix)

xi) If there is no significant change in estimates of the fault location noted in (ix) then output the estimate of the fault location as the final result.

Line Calibration

As mentioned above, the value of the transmission line impedance plays an important part in this method of system fault location. This is because the fault distance is determined by comparing the calculated impedance between the measurement point and the point at which faults occur with the actual line impedance. The line impedance information has to be known before the fault can be located and this could be achieved through calibration. One method of transmission line calibration is described below.

Figure 7:
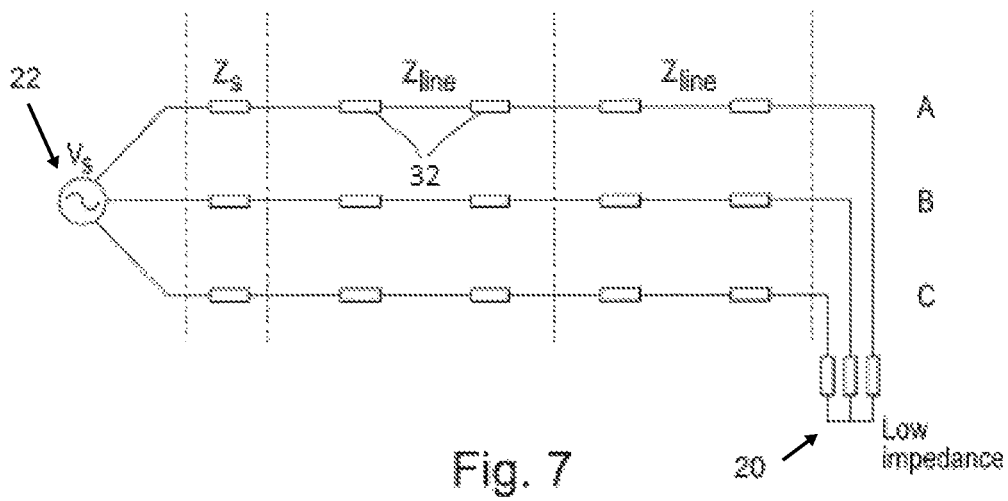
FIG. 7 illustrates an experimental three-phase power distribution system, each transmission line including four π section circuits.
Figure 8:
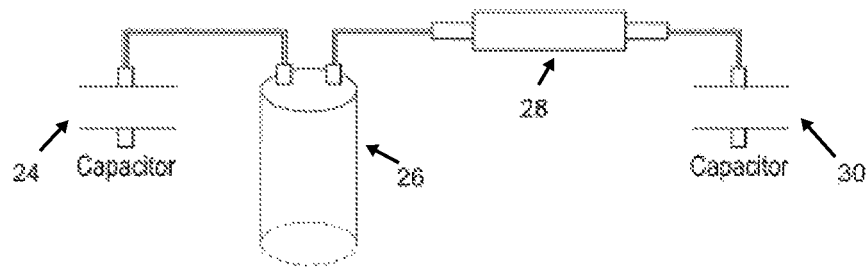
FIG. 8 illustrates a π section circuit.

An experimental three phase test circuit was built with a transmission line for each phase (A, B and C) being represented by four identical π circuits 32. The circuit also included a resistive load 20 and a programmable AC voltage supply 22, as depicted in FIG. 7. There are 12 sections of π circuits in the three phase transmission circuit in the experimental system and each section includes a first capacitor 24, an inductor 26, a resistor 28, and a second capacitor 30 in series, is as depicted in FIG. 8. The steady state line impedance (resistor, inductor and capacitor) of each section in each phase was measured with an impedance analyser interface (IAI).

The directly measured impedances of each component vary and the smallest and biggest values are shown as in Table 2

TABLE 2

| the results range of each component | | | |
|---|---|---|---|
| | Resistor | Inductor | Capacitor |
| maximum value | 28.3 mΩ | 6.4 μH | 375 pF |
| minimum value | 15.4 mΩ | 5.3 μH | 330 pF |

The variation of the measured result, compared with the component's name plate value, is mostly due to the connection point of components itself. The measurement equipment IAI is calibrated before and each value is the average of 5 measurements and the 5 different measurements have a standard deviation of less than 5%.

Figure 9:
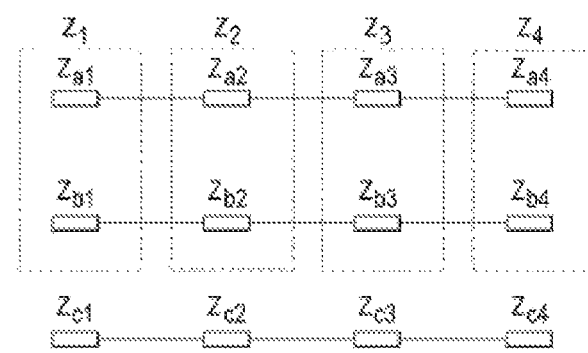
FIG. 9 schematically depicts calibrating line impedance.

The second step is to calibrate transmission line impedance in pairs between each of the two phases. In a three phase system, in order to locate the phase to phase fault the actual line impedance used should be the impedance of both lines. For example, between phase A and phase B, the calibrated impedance are the line pairs shown in FIG. 9.

The results of each pair of impedances are showed in Table 3

TABLE 3

| | calibrated impedance in pairs | | |
|---|---|---|---|
| | Resistor | Inductor | Capacitor |
| maximum value | 64.5 mΩ | 14.6 µH | 375 pF |
| minimum value | 30.3 mΩ | 12.1 µH | 330 pF |

Because mutual inductance exists between the lines, the line inductance pairs calibrated between two lines is more than twice that of the single inductor. Notice the large variation in resistance. This should not affect the iteration algorithms, as these values are considerably less than the fault impedance when the load impedance needs to be considered.

Experimental Results

A series of phase to phase short circuit faults were applied along each section of the experimental system using an insulated bipolar gate transistor (IGBT) as a switchable short circuit. A short circuit fault was imposed at each section of the transmission line within the system, as shown in FIG. 10.

Figure 10:
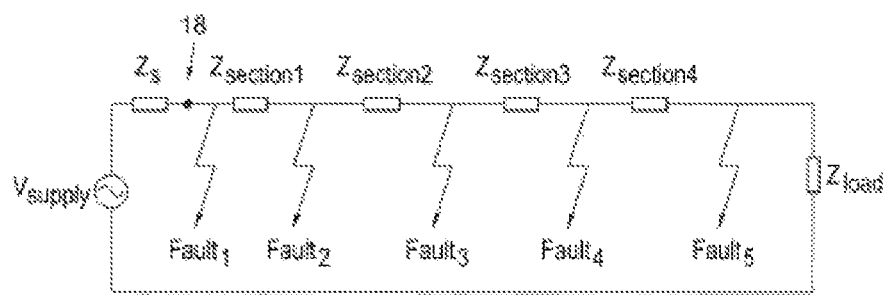
FIG. 10 schematically illustrates faults imposed at various locations along the three phase transmission line.

The current and voltage on the line was then measured continuously at measuring location 18 of FIG. 10 in order to detect transient currents due to the fault. Once the fault trip occurs the current and voltage are recorded before, during and after the fault. The measured current transient and voltage transient during a fault situation is shown in FIG. 11. The fault occurred at zero time on the time axis.

Two cycles of voltage and current were measured. The resulting waveform is shown in the top graph before being filtered, and shown in the bottom graph after being filtered by a low pass filter with cut-off frequency of 4000 Hz. This eliminates most of the high frequency noise. In the example shown, the total data required for fault location is of 8 ms duration of the fault transient, which less is half that required for traditional impedance relay schemes which use supply frequency information (20 ms). This is the case because the example considers frequencies higher than the system frequency. Typically a cycle of data is needed for the fault location method to work. As the frequency used in this example is higher than the system frequency, the time window during which measurements are needed to be made is smaller.

Once the measured data was collected, the voltage iteration (equations 4 and 5) was used to calculate the line impedance, and so the distance to the fault. FIGS. 12A-12D shows example data for fault 3 (see FIG. 10). The filtered voltage transient signal and the filtered current transient signal are shown in the graphs of FIGS. 12A and 12B respectively for a duration of 8 ms from fault inception. FIG. 12C shows the estimated step voltage $V_{pre-f}$ used in the first distance estimation.

Figure 13:
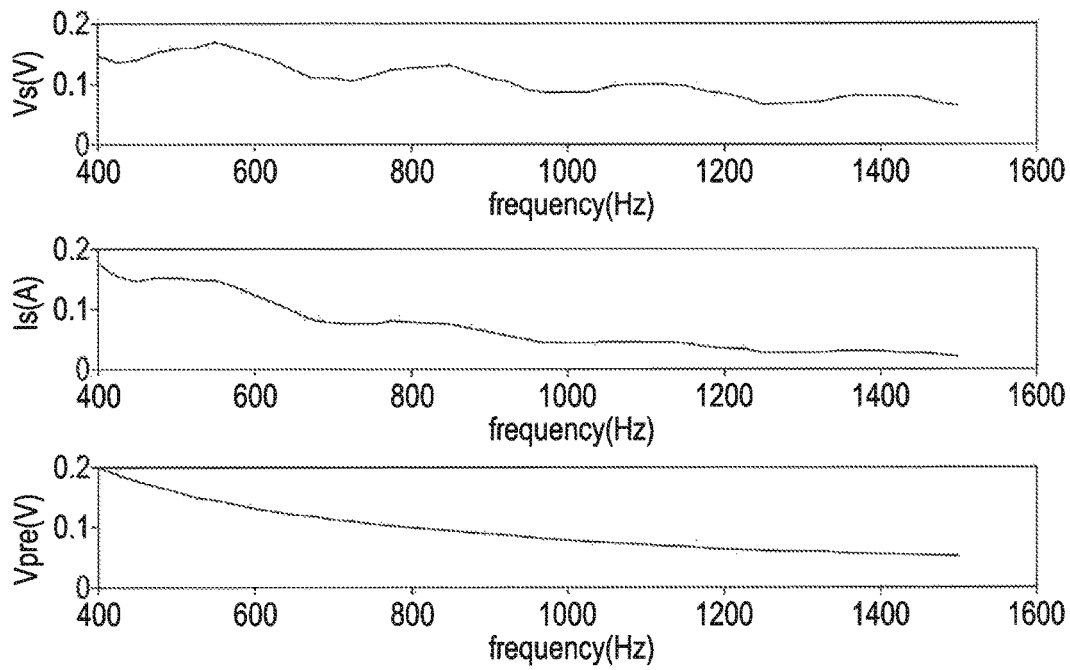
FIG. 13 depicts current and voltage frequency information after the fault (top and middle graphs) and before the fault (bottom graph)

FIG. 12D shows the resulting estimated line reactance compared with the calibrated (known) line reactance. In particular, the dashed line in FIG. 12D shows the calibrated value for the line reactance, and the waveform with an oscillation is the line reactance calculated from measured data without curve fitting. The solid line in FIG. 12D shows the calculated line reactance after being processed by a first order least square curve fitting. The main reason for the oscillation in the calculated result is the discontinuity of the voltage and current which is caused by the reverse blocked IGBT switch. After a fault is imposed on the system, the voltage and current appear discontinuous at the zero crossing time. The discontinuity causes an oscillation in the value of the transient of the voltage and current after the FFT is applied as shown compared with the ideal estimated fault voltage in FIG. 13. Although the IGBT is a non-physical representation of a fault the discontinuity is not unusual for arc faults and so the errors are probably typical of a real fault conditions. However, for a real system with higher supply voltage level and bigger fault transients, this oscillation in the results can be greatly attenuated, as shown in the simulations below.

Figure 14:
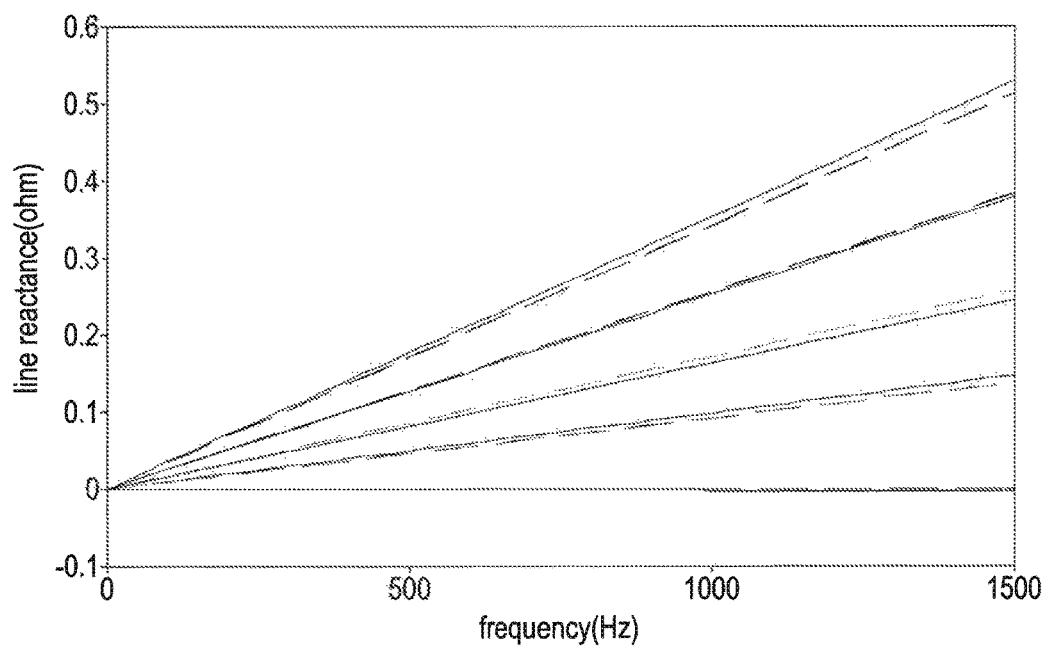
FIG. 14 compares the estimated line reactance to the calibrated line reactance for faults at different fault locations.

FIG. 14 shows the estimated line reactance compared with calibrated reactance when a short circuit fault was imposed at five different locations as described in FIG. 10.

In FIG. 14, the five dashed lines show the calibrated or real line reactance from the measurement point to the fault point at different fault locations and the solid line is the estimated value. The error of each estimated result is within 7% for each section reactance which can be interpreted that the errors are no bigger than 0.4 m in distance. The errors are mainly from the procedure of curve fitting. The oscillation caused by voltage and current is due to the nature of the fault so that the errors do not increase with fault distance.

Figure 15A:
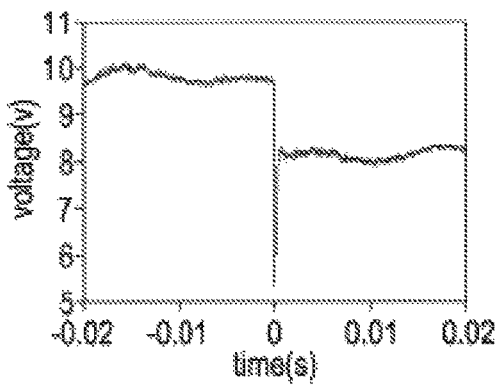
FIG. 15A illustrates for fault 3 of FIG. 10 the measured (filtered) voltage transient signal with a DC voltage supply.
Figure 15B:
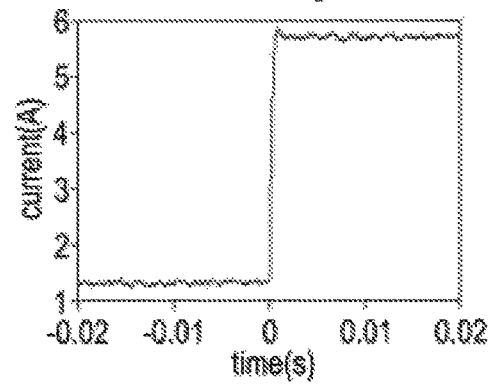
FIG. 15B illustrates for fault 3 of FIG. 10 the measured (filtered) current transient signal with a DC voltage supply.
Figure 15C:
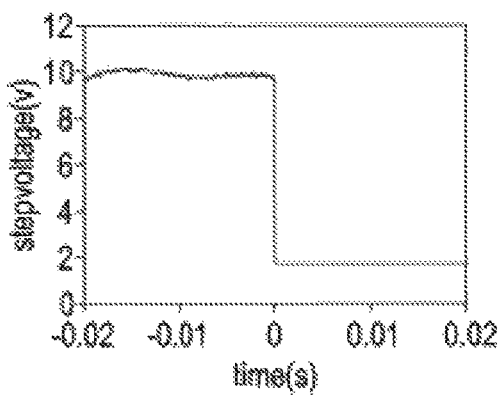
FIG. 15C illustrates for fault 3 of FIG. 10 the estimated step voltage at the fault ($V_{fault\_point}$) with a DC voltage supply.
Figure 15D:
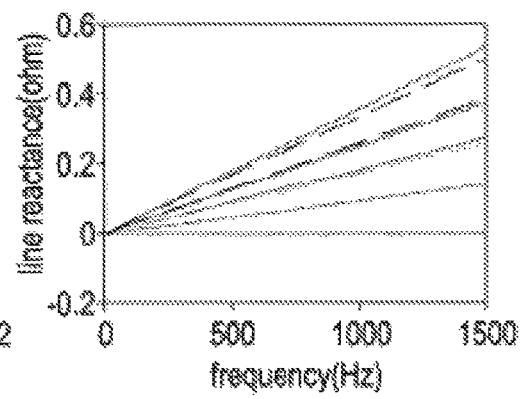
FIG. 15D illustrates for fault 3 of FIG. 10 the estimated line reactance to fault 3 with a DC voltage supply.

This fault location scheme involves using only system transients which are caused by the fault so that it works when the system is supplied with either AC or DC voltage. For the same system with a DC supply, the equivalent results are shown in FIGS. 15A-15D, where FIG. 15A shows the measured transient voltage, FIG. 15B shows the measured transient current, FIG. 15C shows the estimated fault voltage, and FIG. 15D shows the estimated line reactance to the fault. In general it can be seen that the errors in line reactance to the fault are within 7%.

Simulation Results

Figure 16:
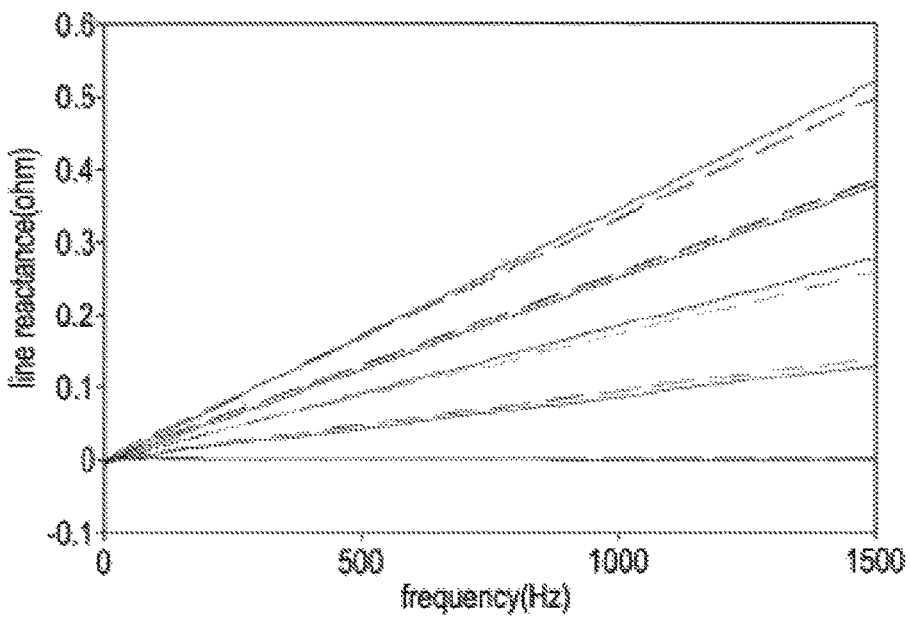
FIG. 16 compares the estimated line reactance to the calibrated line reactance for faults at different fault locations.

The simulation system was constructed by using the same calibrated parameters as the experimental system, so as to validate the experimental results and also to explore situations which the experimental facility could not provide. FIG. 16 shows the simulated results of estimated line reactance compared with real ones for different fault locations with same AC voltage supply as the experiment.

The least square curve fitting method used during processing the simulation data is different from the one used in the experiment. In the simulation, a standard first order polynomial is used as given by equation (17)

$$f(a,b)=a+bx. \tag{17}$$

The discontinuous voltage and current in the simulation created a more regular oscillation around the actual values so that after curve fitting the parameter a is very close to zero. In contrast, in the experiment, the parameter a is forced to zero to optimize the fitted curve. In order to maintain the accuracy, the experimental data is zero padded before FFT and that is not needed for the simulation results.

Since in the simulation system there is no current or voltage limitation, the supply voltage was increased to 600 Vrms (line to line). In this situation, the oscillation caused by voltage and current discontinuities is much smaller. For fault 3 (as shown in FIG. 10), the simulated results are shown in FIGS. 17A-17D. As before, FIG. 17A shows the simulated measured transient voltage, FIG. 17B shows the simulated measured transient current, FIG. 17C shows the estimated fault voltage, and FIG. 17D shows estimated line reactance to the fault.

Compared with FIGS. 12A-12D, for the same fault location, when the voltage level is increased as in the simulated results of FIGS. 17A-17D the oscillation within the line reactance estimated results is attenuated and the accuracy is improved. The fault resistance can be change from 0Ω to 1Ω in the simulation system with same voltage level as experiment. For example, when the fault 3 occurs, the estimated line reactance is shown FIG. 18.

As shown in FIG. 18, the line reactance can be determined within an error of 8%, which is equivalent to an error of 0.45 m in the distance to the fault. For this system when the measured fault resistance is larger than 0.5Ω the impedance iteration is used (equations (14)-(16)) during calculation and for smaller fault impedance, the voltage iteration is used (equations (12) and (13)). For this reason it can be seen that the largest error appears approximately 0.5Ω fault resistance.

Two methods of determining the location of a fault on an electricity line have been discussed above. In the first method, an estimate of the voltage at the fault location is used iteratively to determine an estimate for the distance to the fault. In the second method, an estimate of the resistance of the fault is used to iteratively determine an estimate for the distance to the fault when the load currents are comparable to the fault currents. Both methods make use of measurements of the voltage and current made on the transmission line at a non-system frequency. That is, both methods require measurement/knowledge of the transient current and voltages created by the fault. These transient current and voltage measurements may be made with any suitable detection equipment, e.g. a volt transducer/current transducer in communication with the transmission line.

It will be appreciated that the methods described above are examples only, and that other algorithms/iterations might be used if required. In addition, the voltage iteration need not be confined to use with low impedance faults, but could be used with higher impedance faults, if required. Similarly, the impedance iteration might be used for low impedance faults.

It will be appreciated that the voltage at the fault location $V_{pre-f}$ might be estimated in a different way to that described above.

An alternative method of fault location will now be described which does not require any estimation of the fault voltage or fault resistance. The method described below is a double ended method. That is, it requires measurements of voltage and current to been made on a transmission line at two locations, on either side of a fault location. The alternative method will now be described with reference to FIGS. 19 and 20.

Figure 19:
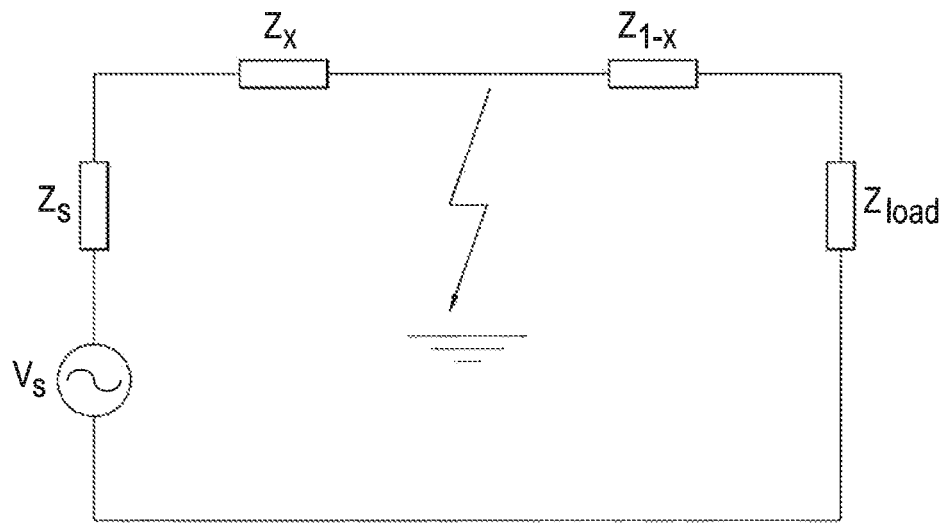
FIG. 19 schematically illustrates a transmission line including a fault in a double ended fault location scheme.

The basis of the double ended location method can be introduced by considering a single phase circuit with a short circuit fault as shown in FIG. 19. In FIG. 19 $Z_s$ is the supply impedance and $Z_{load}$ is load impedance. Assuming the total transmission line impedance between supply and load is $Z_1$, then $Z_x$ is the part of the line between the supply and the point of fault and $Z_{1-x}$ is the remaining part.

As before, the system voltage transient which is created by the fault can be considered to be a harmonic voltage source which contains information in a wide frequency range. The Thèvenin's equivalent circuit, at a non-fundamental frequency, is with the supply voltage short-circuited and the fault as the transient source as depicted in FIG. 20.

Figure 20:
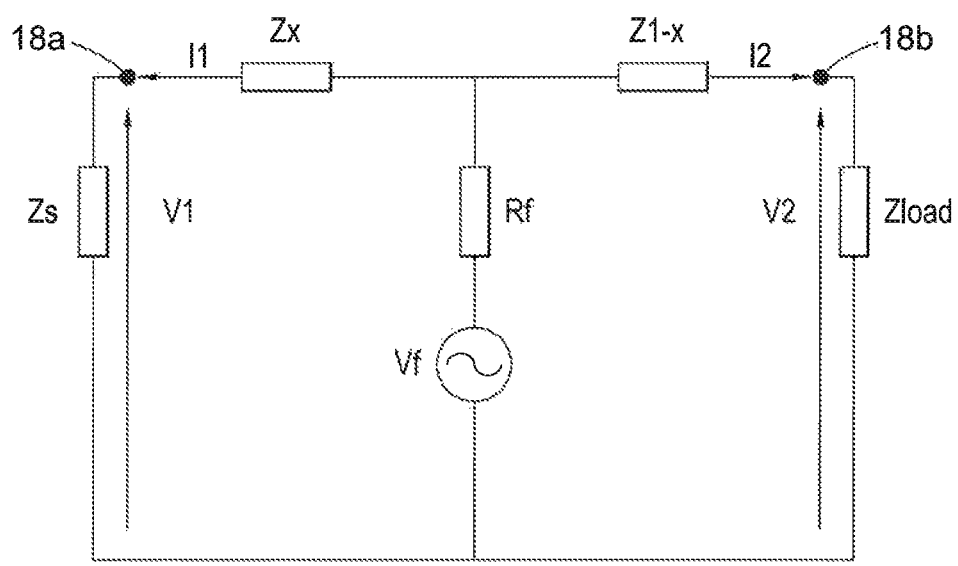
FIG. 20 shows the Thèvenin circuit equivalent to FIG. 19 at a non-fundamental frequency.

As shown in FIG. 20, the fault transient $V_f$ acts as voltage source to provide voltage at non-fundamental frequency. There are two separate measurement locations 18a and 18b located at the supply end and the load end respectively. The voltage and current is measured at both measurement points during the fault situation. The following equation is derived by using Kirchhoff's circuit law according to the circuit in FIG. 20:

$$V_1 + I_1 \cdot Z_x = V_2 + I_2 \cdot Z_{1-x}. \tag{18}$$

The line total impedance $Z_T = Z_x + Z_{1-x}$. Thus:

$$Z_x = \frac{V_2 - V_1 + I_2 \cdot Z_T}{I_1 + I_2}. \tag{19}$$

Equation (19) is then used to estimate the line impedance between the supply and fault point. By dividing the estimated line impedance by the known per-unit length impedance of the line, the fault location can be found. This double-ended scheme does not require the information of fault resistance or the waveform of the fault transient and the calculation is also simple to implement some in some ways it is superior to the single ended schemes described above. However, it does need a communications channel and a technique for overcoming any lack of synchronisation between the end recorders. To overcome possible synchronism errors the following unique approach has been developed.

In a wide utilization of this double-ended fault location scheme, the problem of unsynchronization may cause inaccurate fault location estimation. In a larger distribution system the, synchronization trigger signal sent in communication channel may have a delay or for some situation it is unable to provide such signal for certain system. In this situation the, calculation errors due to a lack of synchronisation between the two measurement locations can be cancelled by solving the set of non-linear equations as described by equations (20)-(34).

Considering the synchronization angle between the two sets of measured phase information ($V_1$, $I_1$ and $V_2$, $I_2$) is δ so that the equation (18) can be rewritten as equation (20):

$$V_1 e^{j\delta} + I_1 e^{j\delta} \cdot Z_x = V_2 + I_2 \cdot (Z_T - Z_x). \tag{20}$$

Put $Z_x = xZ_T$ (x is distance of fault and line impedance has linearity against distance) equation (20) can be separated into real part and imaginary part as equation (21) and equation (22):

$$-\text{Re}(V_1)\sin\delta - \text{Im}(V_1)\cos\delta + \text{Im}(V_2) + C_4 = x(C_1\sin\delta + C_2\cos\delta + C_4); \tag{21}$$

$$-\text{Re}(V_1)\cos\delta + \text{Im}(V_1)\sin\delta + \text{Re}(V_2) + C_3 = x(C_1\cos\delta - C_2\sin\delta + C_3). \tag{22}$$

In the equations (21) and (22), $C_1$, $C_2$, $C_3$, $C_4$ are defined as:

$$C_1 = \text{Re}(Z_T) \cdot \text{Re}(I_1) - \text{Im}(Z_T) \cdot \text{Im}(I_1); \tag{23}$$

$$C_2 = \text{Re}(Z_T) \cdot \text{Im}(I_1) + \text{Im}(Z_T) \cdot \text{Re}(I_1); \tag{24}$$

$$C_3 = \text{Re}(Z_T) \cdot \text{Re}(I_2) - \text{Im}(Z_T) \cdot \text{Im}(I_2); \tag{25}$$

$$C_4 = \text{Re}(Z_T) \cdot \text{Im}(I_2) + \text{Im}(Z_T) \cdot \text{Re}(I_2). \tag{26}$$

Eliminating x in equations (21) and (22) by dividing equation (21) by equation (22), the new equation (27) has only one unknown δ:

$$F(\delta) = a \cdot \sin\delta + b \cdot \cos\delta + c = 0. \tag{27}$$

The following equations defines the a, b and c in the equation (27)

$$a = C_3 \text{Re}(V_1) + C_4 \text{Im}(V_1) + C_1 \text{Re}(V_2) + C_2 \text{Im}(V_2) + C_1 \cdot C_3 + C_2 \cdot C_4; \tag{28}$$

$$b = -C_4 \text{Re}(V_1) + C_3 \text{Im}(V_1) + C_2 \text{Re}(V_2) - C_1 \text{Im}(V_2) + C_2 \cdot C_3 - C_1 C_4; \tag{29}$$

$$c = -C_2 \text{Re}(V_1) + C_1 \text{Im}(V_1) + C_4 \text{Re}(V_2) - C_3 \text{Im}(V_r). \tag{30}$$

The equation (27) has unknown δ, which can be solved by using a Newton-Raphson iteration:

$$\delta_{k+1} = \delta_k - \frac{F(\delta_k)}{F'(\delta_k)} \quad k = 1, 2, 3, 4 \ldots; \quad (31)$$

$$F(\delta_k) = b \cdot \cos\delta_k + a \cdot \sin\delta_k + c; \quad (32)$$

$$F'(\delta_k) = a \cdot \cos\delta_k - b \cdot \sin\delta_k. \quad (33)$$

The value of δ is small in most situation and the in first guess of the iteration the $\delta_k$=0. The iteration process stops when the δ meets the requirement to produce an accurate result in the fault location estimation. For example the minimum requirement for the problems considered so far is $\Delta\delta = \delta_{k+1} - \delta_k \langle 10^{-3}$. In the frequency range, for each frequency there is calculated δ. Normally when the measured phase has synchronizing errors the calculated δ will increase with frequency as in equation (34).

$$\delta = \Delta t \cdot 2 \cdot pi \cdot f, \quad (34)$$

where Δt is the time delay caused by phase difference.

In a simulation example, when a fault occurs, 1° phase angle difference between the measured $V_1$, $I_1$ and $V_2$, $I_2$ was set during processing. The calculated results of line reactance compared with calibrated ones are presented in FIG. 21.

Figure 21:
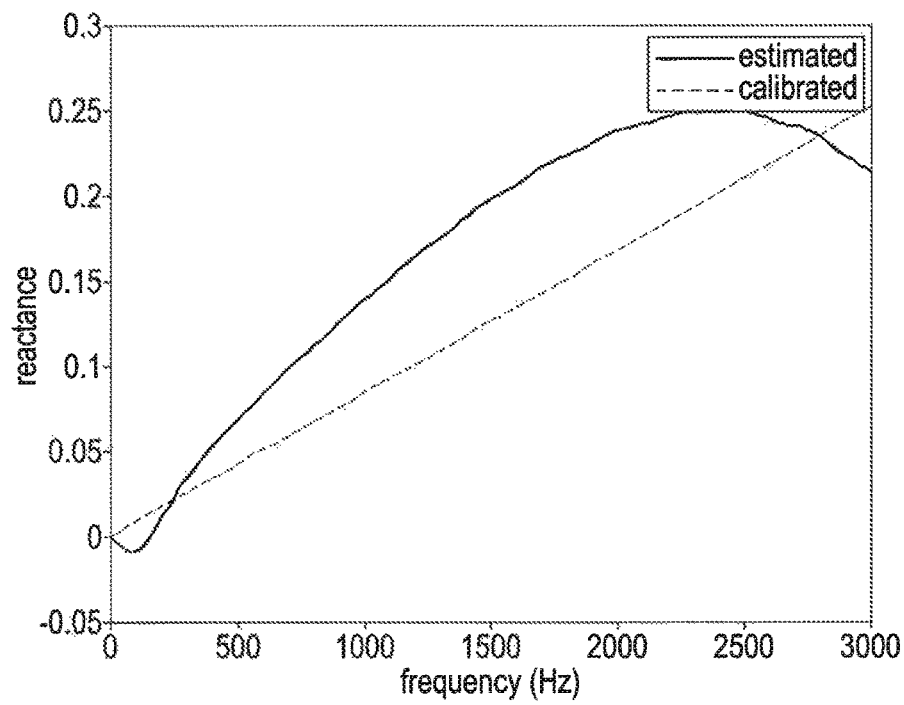
FIG. 21 is a graph comparing estimated line reactance with calibrated line reactance against frequency with phase unsynchronised.
Figure 22:
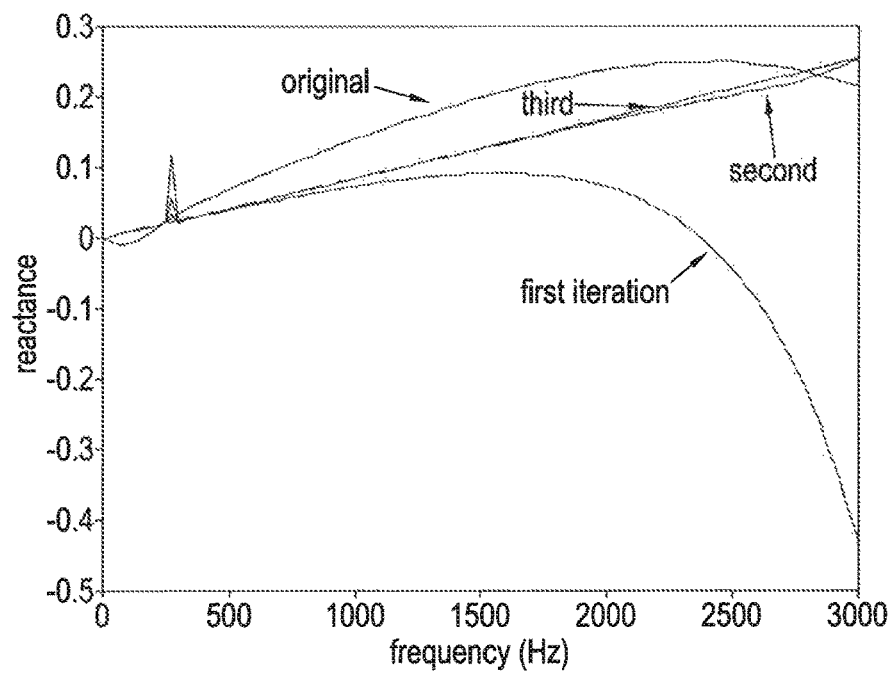
FIG. 22 compares the original estimated line reactance with first, second and third synchronisation iterations.

In FIG. 21, the estimated value (solid line) has a large error compared with the calibrated value because of phase difference. With the same unsynchronized phases and by using the Newton Raphson iteration method described, the estimated results are shown in FIG. 22. It can bee seen that, for a 1° phase difference, only four steps of iteration are enough to produce accurate results.

Figure 23:
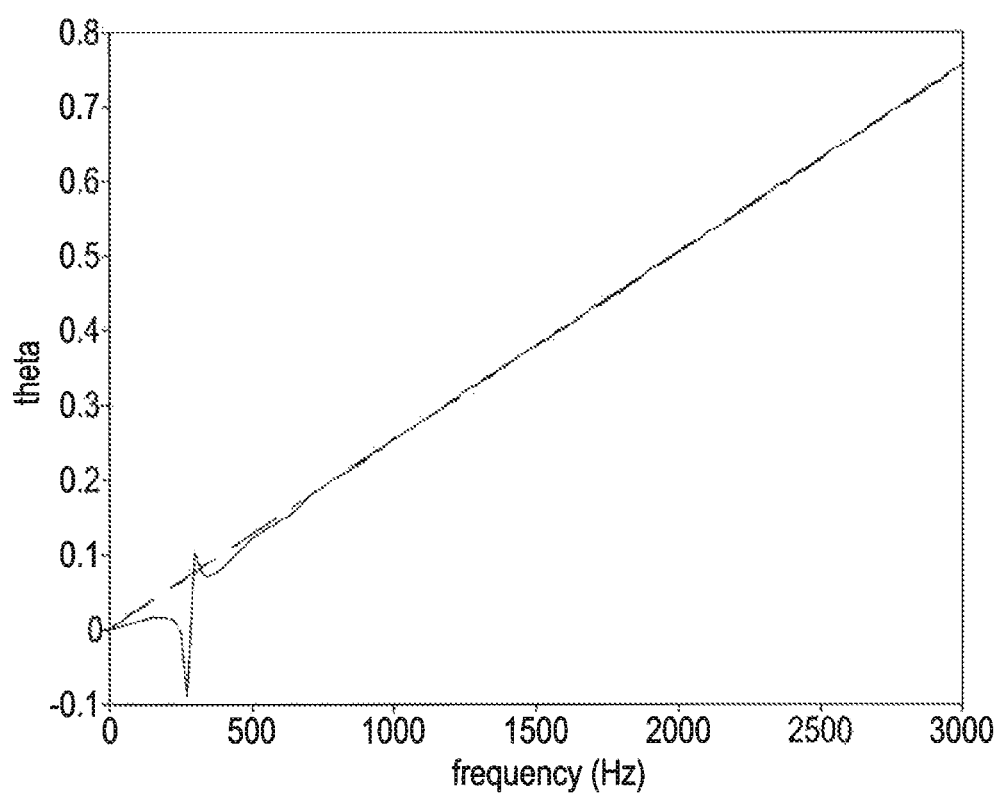
FIG. 23 shows calculated phase angle plotted against frequency.

The calculated phase difference angle against frequency is in FIG. 23. In FIG. 23, the dashed line is the δ result calculated by equation and the solid line is the result calculated during iteration. This complete algorithm therefore comprises an iteration to synchronise the two ended recordings followed by the application of equation (19).

The single ended algorithms and the double ended algorithm described above may be used to determine the location of a fault accurately. Which algorithm is used is dependent to some extent of the characteristics of the fault (e.g. whether the fault impedance is low or not) and on whether measurements are possible at one or more locations. In all cases, the method steps described herein might be executed in any suitable order or combination, as required.

The methods described herein can be used to accurately determine the location of a fault, such as a break, short circuit or discontinuity, on any electricity transmission line, and in some cases to within 0.5 meters of the actual fault location. The iterative nature of the distance estimation described, as well as the use of multiple non-system measurement frequencies, preferably higher than the system frequency, results in an increased accuracy with respect to prior art methods of impedance estimation. In addition, transient currents often occur at higher frequencies than the system frequency, which also enables an increased accuracy distance measurement.

What is claimed is:

1. A method comprising:
    determining a distance from a measurement location on an electricity transmission line to a fault location of a fault on the electricity transmission line, the electricity transmission line having a known line impedance and being operable to transport electricity at one or more system frequencies, and the measurement location being different from the fault location of the fault, wherein the determining is based on (i) one or more measurements of a current and one or more measurements of a voltage on the electricity transmission line at one or more non-system frequencies, which are different from the one or more system frequencies, measured by at least one transducer electrically coupled to the electricity transmission line, and (ii) the known line impedance; and
    locating the fault using the distance from the measurement location on the electricity transmission line to the fault location of the fault on the electricity transmission line that is determined.

2. The method of claim 1 further comprising:
    measuring the one or more measurements of the current and the one or more measurements of the voltage on the electricity transmission line at the one or more non-system frequencies at the measurement location; and
    detecting whether the fault has occurred.

3. The method of claim 2 wherein detecting whether the fault has occurred comprises:
    monitoring the current and the voltage on the electricity transmission line at the one or more non-system frequencies; and
    determining from a presence of signals at a non-system frequency of the one or more non-system frequencies on the electricity transmission line that the fault has occurred.

4. The method of claim 1 wherein the one or more measurements of the current and the one or more measurements of the voltage on the electricity transmission line at the one or more non-system frequencies are made during a predetermined time period after the fault has occurred.

5. The method of claim 4 further comprising rendering the one or more measurements of the current and the one or more measurements of the voltage on the electricity transmission line at the one or more non-system frequencies during the predetermined time period into a frequency domain.

6. The method of claim 1 wherein the one or more measurements of the current and the one or more measurements of the voltage on the electricity transmission line at the one or more non-system frequencies are made at a plurality of frequencies which are each different from the one or more system frequencies.

7. The method of claim 6 wherein each frequency of the plurality of frequencies is greater than the one or more system frequencies and less than or equal to 10,000 Hz.

8. The method of claim 1 further comprising measuring one or more measurements of a current and one or more measurements of a voltage on the electricity transmission line at the one or more system frequencies, and noting the one or more measurements of the current and the one or more measurements of the voltage on the electricity transmission line at the one or more system frequencies immediately prior to an initiation of the fault.

9. The method of claim 1 further comprising using the one or more measurements of the current and the one or more measurements of the voltage on the electricity transmission line at the one or more non-system frequencies to estimate an estimated line impedance of the electricity transmission line at a time of the fault.

10. The method of claim 9 wherein:
the distance from the measurement location on the electricity transmission line to the fault location of the fault on the electricity transmission line comprises a distance $x_f$; and
determining the distance from the measurement location on the electricity transmission line to the fault location of the fault on the electricity transmission line comprises calculating the distance $x_f$ from the estimated line impedance using:

$$x_f = (V_{pre\_f}/I_f - V_f/I_f)/Z_{line\_P}$$

wherein:
$I_f$ is a transient current measured at the measurement location and at a non-system frequency of the one or more non-system frequencies, $V_f$ is a transient voltage measured at the measurement location and at the non-system frequency of the one or more non-system frequencies, $V_{pre\_f}$ is an estimated voltage of a voltage at the fault location of the fault, and $Z_{line\_P}$ is a known line impedance per unit length.

11. The method of claim 10 further comprising conducting a first voltage iteration activity, which comprises calculating a first estimated distance $x_{f1}$ using:

$$x_{f1} = \frac{\text{imag}(V_{pre-f}/I_f - V_f/I_f)}{\text{imag}(Z_{line\_P})}. \quad (A)$$

12. The method of claim 11 wherein calculating the first estimated distance $x_{f1}$ comprises estimating a first voltage $V_1$ for the estimated voltage of the voltage at the fault location of the fault $V_{pre\_f}$ using a voltage measured on the electricity transmission line at the one or more system frequencies immediately prior to an initiation of the fault.

13. The method of claim 12 further comprising conducting a second voltage iteration activity, which comprises estimating a second voltage $V_2$ for the estimated voltage of the voltage at the fault location of the fault $V_{pre\_f}$ using:

$$V_2 = V_1 - I_{pre\_f} \cdot x_{f1} \quad (B)$$

wherein $I_{pre\_f}$ is an estimated current of a current at a fault location of the fault.

14. The method of claim 13 further comprising:
conducting a third voltage iteration activity, which comprises calculating a second estimated distance $x_{f2}$ using equation (A) (mutatis mutandis) and using the second voltage $V_2$ for the estimated voltage of the voltage at the fault location of the fault $V_{pre\_f}$; and
repeating the second voltage iteration activity and the third voltage iteration activity a plurality of times.

15. The method of claim 9 wherein:
the distance from the measurement location on the electricity transmission line to the fault location of the fault on the electricity transmission line comprises a distance $x_f$; and
determining the distance from the measurement location on the electricity transmission line to the fault location of the fault on the electricity transmission line comprises calculating the distance $x_f$ from the estimated line impedance using:

$$Z_{line\_P} \cdot x_f = V_{pre\_f}/I_f - R_f - V_f/I_f - (I_{load}/I_f) \cdot R_f \quad (C)$$

wherein:
$I_f$ is a transient current measured at the measurement location and at a non-system frequency of the one or more non-system frequencies, $V_f$ is a transient voltage measured at the measurement location and at the non-system frequency of the one or more non-system frequencies, $V_{pre\_f}$ is an estimated voltage of a voltage at the fault location of the fault, $Z_{line\_P}$ is a known line impedance per unit length, $R_f$ is a resistance of the fault, and $I_{load}$ is an estimated current at a load end of a system comprising the electricity transmission line.

16. The method of claim 15 further comprising conducting a first impedance iteration activity, which comprises calculating a first estimated distance $x_{f1}$ from equation (C) by:
estimating a first voltage $V_1$ for the estimated voltage of the voltage at the fault location $V_{pre\_f}$;
calculating a first estimated line resistance for the resistance of the fault $R_f$ using:

$$R_f = \text{real}(V_1/I_f - V_f/I_f);$$

and
setting $(I_{load}/I_f) \cdot R_f = 0$.

17. The method of claim 16 further comprising conducting a second impedance iteration activity, which comprises estimating a first estimated current for the estimated current at the load end of the system $I_{load}$ using:

$$\left. \begin{array}{l} \dfrac{I_{load}}{I_s} = \dfrac{Z_s + Z_{line\_p} \cdot x_f}{Z_{load} + Z_{line} - Z_x} \\ Z_s = \dfrac{V_f}{I_f} \end{array} \right\}$$

and using the first estimated distance $x_{f1}$ for the distance $x_f$, wherein $Z_s$ is an impedance of a supply of the system, $Z_{load}$ is an impedance of a load of the system, $Z_{line}$ is a total impedance of the electricity transmission line, and $Z_x$ is an impedance of a part of the electricity transmission line between the supply and the fault location of the fault.

18. The method of claim 17 further comprising:
conducting a third impedance iteration activity, which comprises calculating a second estimated distance $x_{f2}$ using equation (C) (mutatis mutandis) and using the first estimated current for the estimated current at the load end of the system $I_{load}$; and
repeating the second impedance iteration activity and third impedance iteration activity a plurality of times.

19. The method of claim 9 further comprising:
estimating an estimated resistance of the fault $R_f$ using $R_f = \text{real}(V_1/I_f - V_f/I_f)$ prior to calculating a first estimated distance $x_{f1}$, the distance from the measurement location on the electricity transmission line to the fault location of the fault on the electricity transmission line comprising a distance $x_f$; and
determining, based on the estimated resistance of the fault $R_f$, whether to implement:
(a) at least one of a first impedance iteration activity, a second impedance iteration activity, or a third impedance iteration activity to determine the distance $x_f$, wherein the distance $x_f$ is calculated from the estimated line impedance using:

$$Z_{line\_P} \cdot x_f = V_{pre\_f}/I_f - R_f - V_f/I_f - (I_{load}/I_f) \cdot R_f;$$

or
(b) at least one of a first voltage iteration activity, a second voltage iteration activity, or a third voltage iteration activity to determine the distance $x_f$, wherein the distance $x_f$ is calculated from the estimated line impedance using:

$$x_f = (V_{pre\text{-}f}/I_f - V_f/I_f)/Z_{line\_P};$$

wherein:
$I_f$ is a transient current measured at the measurement location and at a non-system frequency, $V_f$ is a transient voltage measured at the measurement location and at the non-system frequency, $V_{pre\text{-}f}$ is an estimated voltage of a voltage at the fault location of the fault, $Z_{line\_P}$ is a known line impedance per unit length, $I_{load}$ is an estimated current at a load end of a system comprising the electricity transmission line, and $V_1$ is a first estimated voltage of the estimated voltage of the voltage at the fault location $V_{pre\text{-}f}$.

20. The method of claim 1 further comprising:
measuring the one or more measurements of the current and the one or more measurements of the voltage on the electricity transmission line at the one or more non-system frequencies at the measurement location and at a second measurement location on the electricity transmission line different from the measurement location and the fault location of the fault;
wherein:
the measurement location is disposed on a first side of the fault location of the fault and the second measurement location is disposed on a second side of the fault location of the fault;
the distance from the measurement location on the electricity transmission line to the fault location of the fault on the electricity transmission line comprises a distance $x_{f1}$;
a distance $x_{f1}$ from the measurement location on the electricity transmission line to the fault location of the fault on the electricity transmission line is estimated using:

$$x_{f1} = \frac{V_2 - V_1 + I_2 \cdot Z_T}{Z_{line\_P} \cdot (I_1 + I_2)},$$

and
$V_1$ is a voltage transient measured at the measurement location, $I_1$ is a current transient measured at the measurement location, $V_2$ is a voltage transient measured at the second measurement location, $I_2$ is a current transient measured at the second measurement location, $Z_{line\_P}$ is a known line impedance per unit length, and $Z_T$ is a total line impedance between the measurement location and the second measurement location.

21. The method of claim 20 further comprising synchronizing measuring the voltage transient measured at the measurement location $V_1$ and the current transient measured at the measurement location $I_1$ with measuring the voltage transient measured at the second measurement location $V_2$ and the current transient measured at the second measurement location $I_2$.

22. The method of claim 1, wherein:
the one or more measurements of the current on the electricity transmission line at the one or more non-system frequencies are measured by at least one first transducer electrically coupled to the electricity transmission line;
the one or more measurements of the voltage on the electricity transmission line the at one or more non-system frequencies are measured by at least one second transducer electrically coupled to the electricity transmission line; and
the at least one transducer comprises the at least one first transducer and the at least one second transducer.

23. A system for locating a fault on an electricity transmission line, the electricity transmission line having a known line impedance and being operable to transport electricity at one or more system frequencies, the system comprising:
at least one transducer electrically coupled to the electricity transmission line and configured to measure a current and a voltage on the electricity transmission line; and
a processor operable to receive one or more measurements of the current and one or more measurements of the voltage on the electricity transmission line made by the at least one transducer, the one or more measurements of the current and the one or more measurements of the voltage being measured at one or more non-system frequencies which are different from the one or more system frequencies, and being configured to determine a distance from a measurement location on the electricity transmission line to a fault location of the fault on the electricity transmission line based on the measurements of the current and the voltage on the electricity transmission line and based on the known line impedance.

24. The system of claim 23 wherein the one or more measurements of the current and the one or more measurements of the voltage on the electricity transmission line are made during a predetermined time period after the fault has occurred.

25. The system of claim 23, wherein:
the one or more measurements of the current on the electricity transmission line at the one or more non-system frequencies are measured by at least one first transducer electrically coupled to the electricity transmission line;
the one or more measurements of the voltage on the electricity transmission line the at one or more non-system frequencies are measured by at least one second transducer electrically coupled to the electricity transmission line; and
the at least one transducer comprises the at least one first transducer and the at least one second transducer.

* * * * *